(12) United States Patent
Maeda et al.

(10) Patent No.: US 8,200,304 B2
(45) Date of Patent: Jun. 12, 2012

(54) JOSEPHSON JUNCTION AND JOSEPHSON DEVICE

(75) Inventors: Atsutaka Maeda, Shibuya-ku (JP); Espinoza Luis Beltran Gomez, Setagaya-ku (JP)

(73) Assignee: Japan Science and Technology Agency, Saitama (JP)

( * ) Notice: Subject to any disclaimer, the term of this patent is extended or adjusted under 35 U.S.C. 154(b) by 681 days.

(21) Appl. No.: 12/305,201

(22) PCT Filed: Jul. 20, 2007

(86) PCT No.: PCT/JP2007/064321
§ 371 (c)(1),
(2), (4) Date: Dec. 16, 2008

(87) PCT Pub. No.: WO2008/010569
PCT Pub. Date: Jan. 24, 2008

(65) Prior Publication Data
US 2009/0233798 A1 Sep. 17, 2009

(30) Foreign Application Priority Data

Jul. 20, 2006 (JP) .................................. 2006-198705
Dec. 8, 2006 (JP) .................................. 2006-332346

(51) Int. Cl.
*H01L 39/22* (2006.01)
*G01R 33/035* (2006.01)

(52) U.S. Cl. .......... 505/190; 505/702; 505/874; 257/33; 257/34; 257/331; 257/E39.014; 365/162

(58) Field of Classification Search .................. 505/190, 505/329, 702, 817, 832, 861, 864; 257/31–36, 257/E39.014; 365/160–162
See application file for complete search history.

(56) References Cited

U.S. PATENT DOCUMENTS

| 5,039,656 | A | * | 8/1991 | Hidaka ......................... 505/171 |
| 5,930,165 | A | * | 7/1999 | Johnson et al. ................ 365/171 |
| 6,229,154 | B1 | | 5/2001 | Nojima et al. |
| 2002/0117656 | A1 | | 8/2002 | Amin et al. |

FOREIGN PATENT DOCUMENTS

| JP | 02-153580 | A | | 6/1990 |
| JP | 03-094485 | | * | 4/1991 |
| JP | 04-287381 | A | | 10/1992 |

(Continued)

OTHER PUBLICATIONS

Translation of PCT/ISA/237, IB338, and IB373 of PCT/JP2007/064321.

(Continued)

*Primary Examiner* — Stanley Silverman
*Assistant Examiner* — Kallambella Vijayakumar
(74) *Attorney, Agent, or Firm* — Chen Yoshimura LLP

(57) ABSTRACT

A novel Josephson junction and a novel Josephson junction device are provided which eliminates the need to form an insulating barrier layer. The Josephson junction (1) comprises a superconductor layer (2) and a ferromagnetic layer (3) formed on a middle part (2C) of the superconductor layer (2). The ferromagnetic layer (3) may consist of an electrically conductive or insulating ferromagnetic layer, and may be an electrically conductive ferromagnetic layer formed via an insulating layer. With the superconductor layer (2) formed of a high temperature superconductor, a Josephson junction (1) is provided having large $I_c R_N$ product. The Josephson junction (1) can be used as a junction for a variety of Josephson devices.

19 Claims, 21 Drawing Sheets

FOREIGN PATENT DOCUMENTS

| JP | 05-251768 A | 9/1993 |
|----|-------------|--------|
| JP | 11-346010 A | 12/1999 |
| JP | 2001-189498 A | 7/2001 |
| JP | 2004-523907 A | 8/2004 |

OTHER PUBLICATIONS

Gomez Espinoza Luis Beltran, "High Frequency Electrical Transport Measurements of Niobium SNS Josephson Junction Arrays and Niobium Thin Films with Nanoscale Size Magnetic Dot Array", Doctoral thesis, University of Cincinnati, submitted May 30, 2003. Mentioned on p. 1 of the as-filed translation of the specification.

S. Yorozu "Single Flux Quantum Device", Solid-State Physics, vol. 40, No. 10, pp. 807-816, Oct. 15, 2005. Mentioned on p. 1 of the as-filed translation of the specification as concise explanation of relevance.

International Search Report (ISR) for PCT/JP2007/064321, citing documents indicated above, 2007.

PCT/ISA/237 in PCT/JP2007/064321 and its English translation of Section V, 2007.

\* cited by examiner (A)

(B)

(C)

(A)

(B)

(C)

(A)

(B)

(C)

(A)

(B)

(C)

(D)

(A)

(B)

(A)

(B)

(A)

(B)

(A)

(B)

(A)

(B)

JOSEPHSON JUNCTION AND JOSEPHSON DEVICE

TECHNICAL FIELD

The present invention relates to a novel Josephson junction and a novel Josephson device, using a superconductor, especially a high temperature superconductor.

BACKGROUND ART

So far, when as a superconducting tunnel junction, i.e., Josephson junction, a SIS type Josephson junction in which an oxide film (I) is sandwiched between a pair of superconductor layers (S) is to be made, it is necessary to perform three times film forming steps that a superconductor layer, an insulating barrier layer and a superconductor layer are deposited in this order (see, e.g., Nonpatent Reference 1). The property of superconducting tunnel junction is characterized by the so-called $I_cR_N$ product. Larger this value, the better a junction ensued.

The single flux quantum device (hereinafter, referred to conveniently as "SFQ device") is a logic circuit using the Josephson junction (see Nonpatent Reference 2). In a SFQ device, the logic circuit is configured utilizing a pulsed voltage generated when the Josephson junction is traversed by a single flux quantum. The switching speed in this case is inversely proportional to the $I_cR_N$ product. Thus, the larger the $I_cR_N$ product, the higher the speed at which it operates. The $I_cR_N$ product increases generally in proportion to the critical temperature (Tc) of a superconductor used in the Josephson junction.

Nonpatent Reference 1: Gomez Espinoza Luis Beltran, doctoral thesis, USA, Cincinnati University, submitted May 30, 2003;

Nonpatent Reference 2: S. Yorozu "Single Flux Quantum Device", Solid-State Physics, Vol. 40, No. 10, p. 807, 2005

DISCLOSURE OF THE INVENTION

Problems to be Solved by the Invention

A large $I_cR_N$ product of a Josephson junction that is made of a high temperature superconductor layer is predicted, since the Tc of the high temperature superconductor is higher than that of a traditional superconductor such as Nb. With an existing high temperature superconductor, however, only a Josephson junction has been obtained having its $I_cR_N$ product which is as low as 10% of the theoretically expected value, presenting the problem that the $I_cR_N$ product cannot be increased.

Especially with a high temperature superconductor, it is very difficult to enhance the controllability and reproducibility of forming an insulating barrier layer, so that it presents the problem that a superconducting SIS type tunnel junction of good quality cannot be formed.

With these problems taken into account and to overcome the technological difficulty that an insulating barrier layer of good quality cannot be obtained in a SIS type Josephson junction made of a superconductor, especially high temperature superconductor, it is an object of the present invention to provide a novel Josephson junction and a novel Josephson junction device which eliminate the need to form an insulating barrier layer.

Means for Solving the Problems

In order to achieve the object mentioned above, there is provided in accordance with the present invention a Josephson junction characterized in that it comprises a superconductor layer and a ferromagnetic layer formed on a middle part of said superconductor layer.

In the structure mentioned above, the ferromagnetic layer may consist of one of an electrically conductive ferromagnetic layer and an insulating ferromagnetic layer.

The present invention also provides a Josephson junction, characterized in that it comprises a superconductor layer and an electrically conductive ferromagnetic layer formed via an insulating layer on a middle part of the superconductor layer.

In the structure mentioned above, the middle part of the superconductor layer preferably has a width substantially equal to a coherence length of the superconductor layer.

A portion on the middle part and those on its both sides of the superconductor layer preferably have each a width substantially equal to a coherence length of the superconductor layer.

The Josephson junction so constructed as mentioned above allows controlling its superconductivity with the ferromagnetic layer formed on the middle part of the superconductor layer or the electrically conductive ferromagnetic layer formed via the insulating layer, which is magnetic. Especially, to a high temperature superconductor layer, when bringing about transition from the superconductor (hereinafter referred to also as "S" conveniently) to an insulator (hereinafter referred to also as "I" conveniently), those ferromagnetic layers can act as a barrier. Accordingly, a Josephson junction of the present invention operates as the so-called SIS type or SNS (Super-Normal-Super) Josephson junction.

The Josephson junction of the present invention has a simple structure than that of the conventional SIS or SNS Josephson junction. Thus, the process steps needed for its manufacture can be reduced in number than those for the manufacture of the conventional SIS type or SNS type Josephson junction.

Thus, since the Josephson junction of the present invention eliminates the need to use the process of forming an insulating barrier layer which has hitherto posed a serious problem in the SIS type Josephson junction using a high temperature superconductor, the reproducibility and controllability of its electrical properties can be improved significantly. This makes it possible to provide a Josephson junction that has an increased $I_cR_N$ product when using a high temperature superconductor.

The present invention further provides a Josephson device with a Josephson junction characterized in that it comprises a superconductor layer and a ferromagnetic layer formed on a middle part of the superconductor layer.

In the structure mentioned above, the ferromagnetic layer may consist of one of an electrically conductive ferromagnetic layer and an insulating ferromagnetic layer.

The present invention also provides a Josephson device with a Josephson junction characterized in that it comprises a superconductor layer and an electrically conductive ferromagnetic layer formed via an insulating layer on a middle part of said superconductor layer.

According to the structure mentioned above, a barrier is formed by the ferromagnetic layer formed on, or an electrically conductive ferromagnetic layer formed via an insulating layer on a middle part of the superconductor layer to provide a Josephson device with a SIS type Josephson junction. The Josephson junction has the simple structure and requires no tunneling oxide film as in the prior art. This makes it possible to increase the $I_cR_N$ product of a Josephson junction using a high temperature superconductor, the resultant Josephson junction operating at an increased speed. Since the Josephson device of the present invention has the simple structure, it is easy in integration and makes possible for a variety of Josephson devices with Josephson junctions operating with an improved performance.

EFFECTS OF THE INVENTION

According to the present invention, a novel SIS type Josephson junction and a novel Josephson device are provided using a barrier layer consisting of a ferromagnetic layer. This Josephson junction allows an increased $I_c R_N$ product to be obtained in a SIS type Josephson junction, especially using a high temperature superconductor of high Tc. Since the individual Josephson junctions have an increased $I_c R_N$ product, the Josephson device using such Josephson junctions can provide a logic circuit operating at increased speed.

Figure 1:
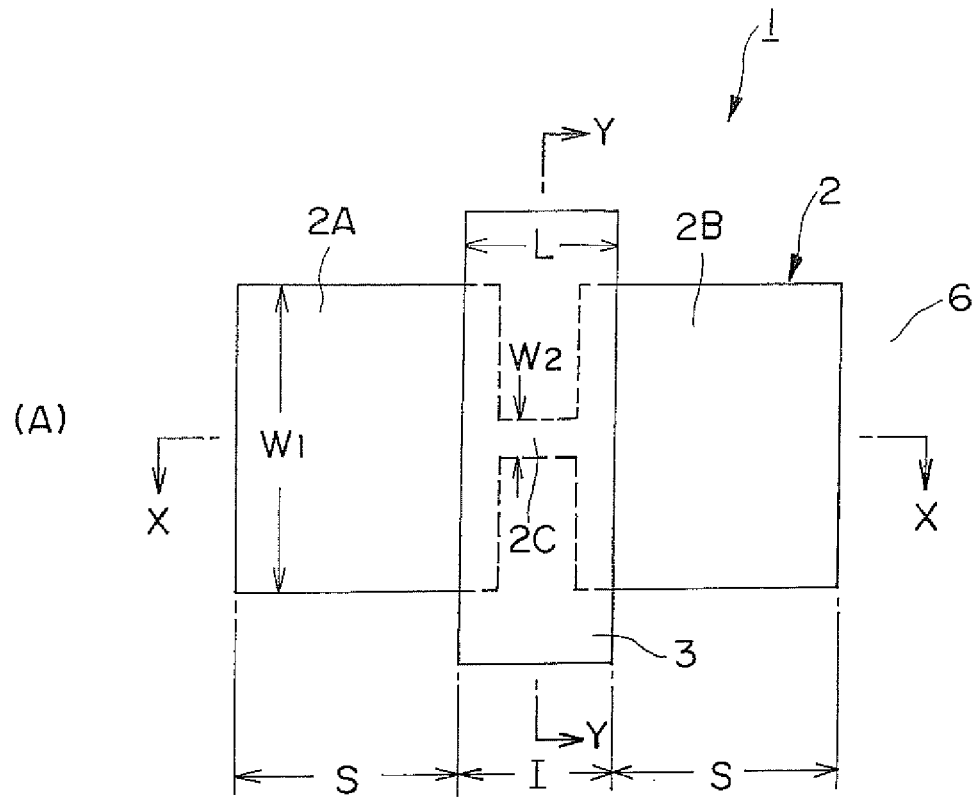
FIG. 1 diagrammatically illustrates a Josephson junction according to a first form of implementation of the present invention in which (A) is a plan view thereof, (B) is a cross sectional view taken along the line X-X in (A) and (C) is a cross sectional view taken along the line Y-Y in (A)
Figure 1:
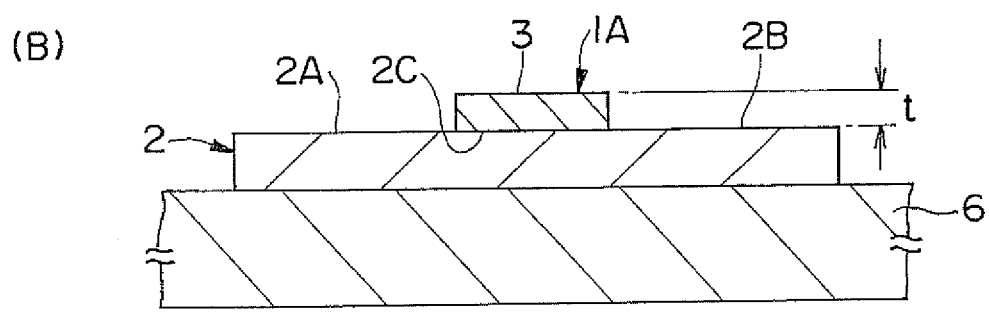
Figure 1:
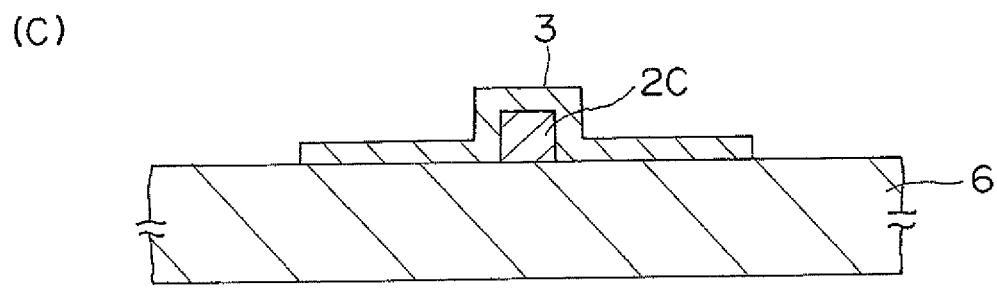

BRIEF DESCRIPTION OF THE REFERENCE CHARACTERS 1, 8, 8A, 10: Josephson junction
2, 33, 41, 46: superconductor layer
  (high temperature superconductor layer)
2A, 2B: electrode
2C, 42, 47: narrowed portion
3, 34, 43, 53, 57: insulating ferromagnetic layer
6: substrate
12, 64: electrically conductive ferromagnetic layer
14: insulating layer
20: superconducting quantum interference device (RF-SQUID)
20A, 20B: current terminal
25: superconducting quantum interference device (DC-SQUID)
25A, 25B: current terminal
30: single flux quantum device
31: grounding layer
32: insulating layer
33A, 33B: end
40, 45, 50, 55: array with Josephson junctions
61: electron beam exposure resist
62: electron beam exposure
63: resists pattern
65: etching pattern
70: pulsed laser ablation apparatus
71: vacuum chamber
71A: window
72: target
73: substrate
74: substrate holder
75: vacuum gage
76: evacuator
77: oxygen gas inlet 78: pulsed laser
79: lens
81: target rotator

BEST MODES FOR CARRYING OUT THE INVENTION

An explanation in detail is given hereinafter of forms of implementation of the present invention with reference to the Drawing Figures in which same reference characters are used to indicate same or corresponding members.

At the outset, a Josephson junction 1 according to a first form of implementation of the present invention will be described. FIG. 1 diagrammatically shows a Josephson junction according to the first form of implementation of the present invention in which (A) is a plan view thereof, (B) is a cross sectional view taken along the line X-X in (A) and (C) is a cross sectional view taken along the line Y-Y in (A).

As shown in FIG. 1(A), the Josephson junction 1 according to the first form of implementation has the structure that a narrowed portion 2C of a thin layer 2 of a superconductor (hereinafter referred to as "superconductor layer") formed on a substrate 6 is covered by a electrically insulating ferromagnetic layer 3 (hereinafter referred to as "insulating ferromagnetic layer").

Here, the superconductor used to constitute the superconductor layer 2 can be any one of superconductor such as niobium, niobium nitride, aluminum, lead or a high temperature superconductor made of copper oxide and others. The copper oxide superconductor may be listed a compound consisting of La, Sr, Cu and O (LSCO), a compound consisting of Y, Ba, Cu and O (YBCO) or a compound consisting of Bi, Sr, Ca, Cu and O (BSCCO). Especially, using a high temperature superconductor of high Tc allows a Josephson junction having an increased $I_c R_N$ product. In the following description, the superconductor layer 2 is explained as a high temperature superconductor layer.

The Josephson junction 1 has a narrowed structure, i.e., the so-called bridge structure, that the width $W_2$ of a portion of high temperature superconductor layer 2C covered with the insulating ferromagnetic layer 3 is narrower than the width $W_1$ of portions of high temperature superconductor layer 2A and 2B at its both sides becoming electrodes.

The width $W_2$ of the narrowed layer 2C may be 5 µm or less and may be not much more or less than a coherence length of the high temperature superconductor layer 2, that is, for example, 30 nm to 50 nm. While the narrowed structure is shown that only the mid region of the high temperature superconductor layer 2 is narrowed as 2C, it may be a fine line structure that not only the middle region of the high temperature superconductor layer 2 but also the width $W_1$ of its both sides as the electrodes 2A and 2B are narrowed. For example, the width of the entire high temperature superconductor layer 2 may be reduced to $W_2$. It is necessary that the width $W_2$ of the high temperature superconductor layer 2C be set so that the current distribution becomes uniform. This is because if the current distribution is not uniform, a Josephson flux will be created, hindering the operation. For this reason, the width $W_2$ of the middle part (narrowed part 2C) of high temperature superconductor layer 2 must be conditioned as under around a Josephson penetration length. Since the Josephson penetration length is inversely proportional to the critical current, it may be just sufficient to vary the temperature so that the Josephson junction may satisfy this condition.

Only the restriction imposed on the thickness $t_s$ of the layer 2 of a high temperature superconductor is that it is the required minimum value or more to exhibit the superconductivity. A specific value thereof depends on what material as the superconductor is used. For example, in the case of a copper oxide superconductor used in Example to be described later there is an instance according to a past reference that comparatively favorable superconductivity is exhibited with a thickness of several nm.

As shown in FIGS. 1(B) and 1(C), the narrowed structure 1A in the Josephson junction 1 is configured so that the narrowed portion 2C of superconductor layer 2 is covered with the insulating ferromagnetic layer 3. The width L in the X direction of the insulating ferromagnetic layer 3 is sufficient if it is a length to cover the narrowed portion 2C of high temperature superconductor layer 2. For example, while the Josephson effect does not occur theoretically unless the width L of the insulating ferromagnetic layer 3 is not much more or less than a coherence length of the superconductor, there is a possibility that due to an unelucidated mechanism the Josephson effect still occurs with a longer length. In that case, there becomes practically no strict limitation on size. Specifically, the width L of the insulating ferromagnetic layer 3 may be sufficient if it lies in a range from 30 nm to 1000 nm. The thickness of the insulating ferromagnetic layer 3 in the direction of deposition is to be set that there exhibits the Josephson characteristics to compress the superconductivity property of the high temperature superconductor layer 2 below the insulating ferromagnetic layer 3. The thickness of the insulating ferromagnetic layer 3 has no such limitation on its thickening. For example, the thickness may be 10 nm or more ($t \geq 10$ nm). If the insulating ferromagnetic layer has a thickness less than 10 nm, it is undesirable since it fails to act as a barrier to the narrowed portion 2C in the high temperature superconductor layer as will be described below.

According to a Josephson junction 1 so constructed as mentioned above, the insulating ferromagnetic layer 3 covered on a narrowed portion (middle part) 2C of the high temperature superconductor layer 2 is ferromagnetic and exhibits the ability to act to restrain the superconductivity of the high temperature superconductor layer 2 at its narrowed portion (middle part) 2C. Since a transformation from superconductor (S) to insulator (I) is brought about in particular for the narrowed portion (middle part) 2C of the high temperature superconductor layer 2, there develops a barrier. Thus, a Josephson junction 1 of the present invention operates as the so-called SIS type Josephson junction. It is possible to freely control the strength of bond in the Josephson junction 1 by suitably setting the dimensions and thickness of the insulating ferromagnetic layer 3 and the dimensions of the underlying high temperature superconductor layer 2C. Since the fabrication process like that for a semiconductor integrated circuit is applicable for this Josephson junction 1 as will be described later, Josephson junction 1 is suitable to form a superconducting large-scale integrated circuit.

While the structure in FIG. 1 is shown that the narrowed portion 2C of the high temperature superconductor layer 2 is covered with the insulating ferromagnetic layer 3, the narrowed portion 2C of the high temperature superconducting layer 2 may be formed on the insulating ferromagnetic layer 3 to construct a SIS type Josephson junction 1.

Next, a Josephson junction 8 according to a second form of implementation will be described.

Figure 2:
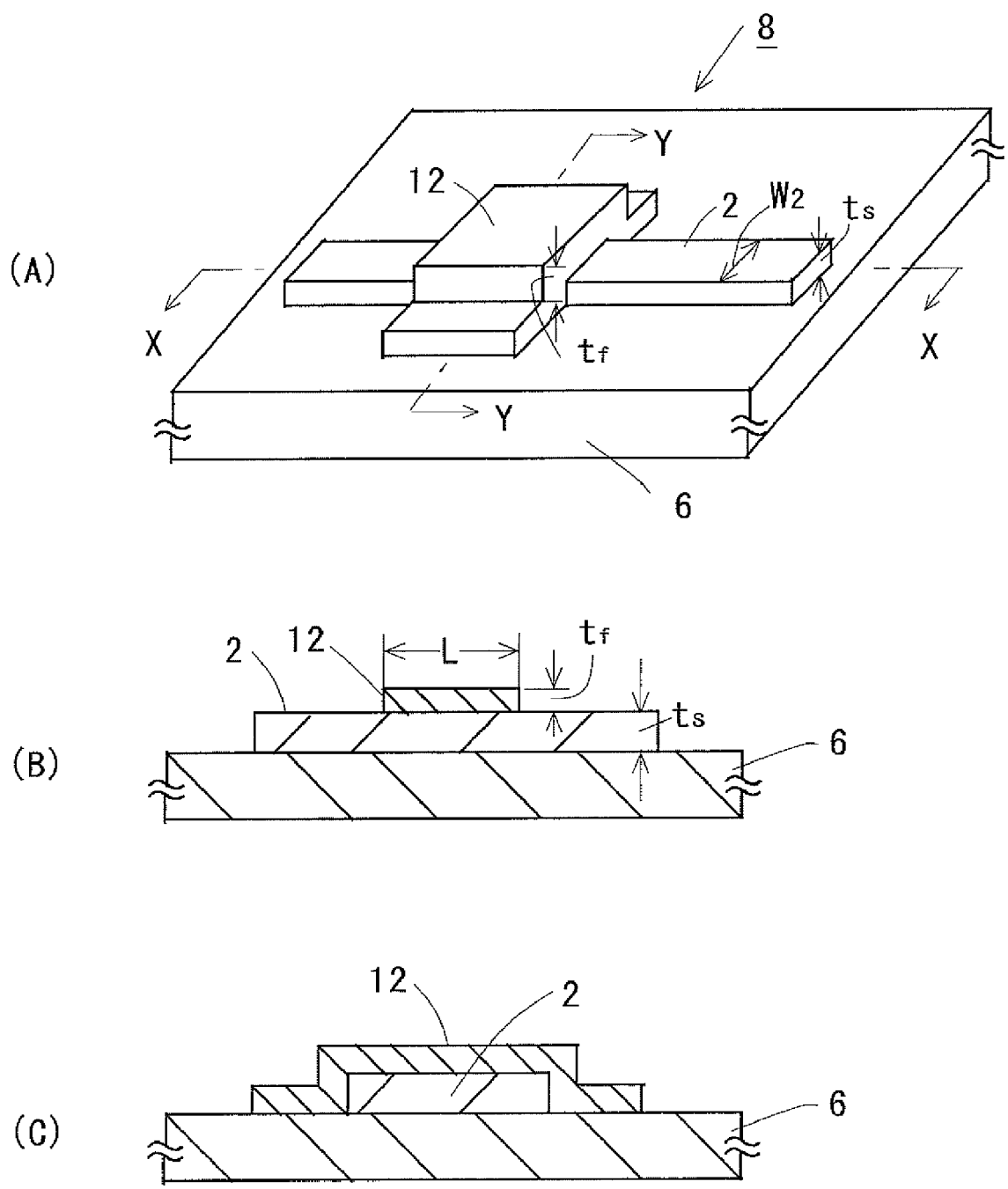
FIG. 2 diagrammatically illustrates a Josephson junction according to a second form of implementation of the present invention in which (A) is a perspective view thereof, (B) is a cross sectional view taken along the line X-X in (A) and (C) is a cross sectional view taken along the line Y-Y in (A)

FIG. 2 diagrammatically illustrates a Josephson junction 8 according to a second form of implementation of the present invention in which (A) is a perspective view thereof, (B) is a cross sectional view taken along the line X-X in (A) and (C) is a cross sectional view taken along the line Y-Y in (A). As shown in FIG. 2, the Josephson junction 8 differs from the Josephson junction 1 as shown in FIG. 1 that the superconductor layer 2 has the width $W_2$ while the insulating ferromagnetic layer 3 is constituted by an electrically conductive ferromagnetic layer 12 having a thickness $t_f$. Since the other respects are identical to those of the Josephson junction 1, the repeated mention is omitted.

In the Josephson junction 8 according to the second form of implementation, the electrically conductive ferromagnetic layer 12 covered on the high temperature superconductor layer 2 is designed to act to restrain the high temperature superconductor layer. Since a transformation from superconductor to insulator especially for the high temperature superconductor layer 2 is occurred, there develops a barrier in the junction. As the ferromagnetic layer 12 is electrically conductive, Josephson junction 8 acts as an SNS type rather than the SIS type. Accordingly, the Josephson junction 8 according to the second form of implementation unlike the Josephson junction 1 in the first form of implementation operates as the SNS type Josephson junction.

Figure 3:
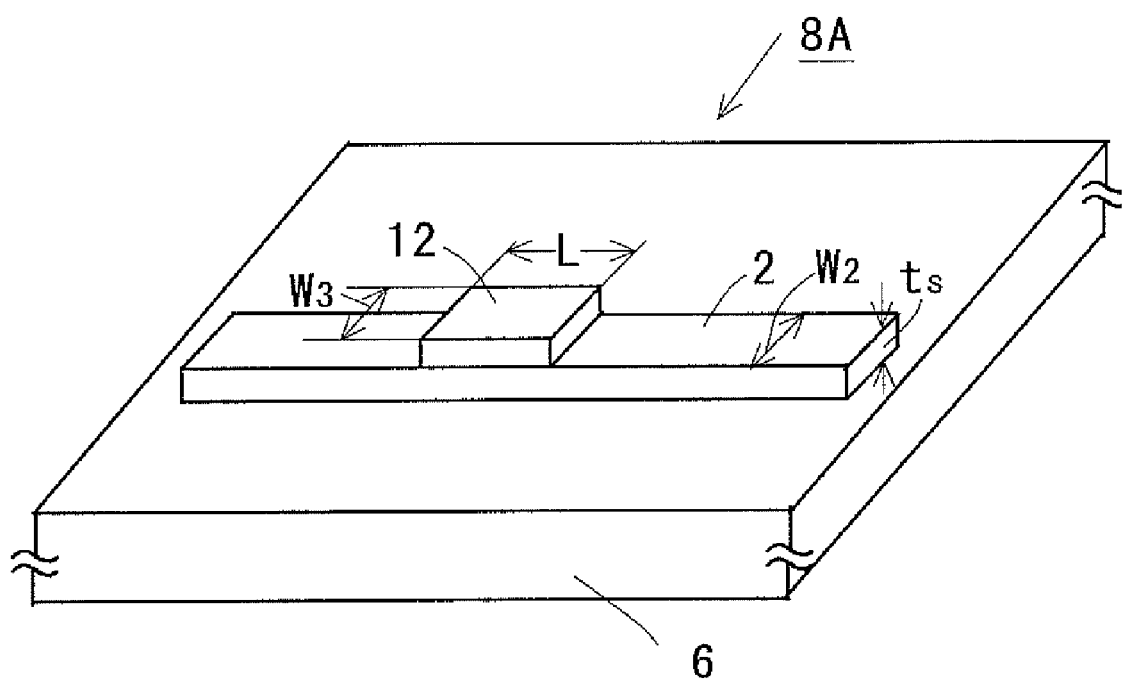
FIG. 3 is a perspective view illustrating a modification of the Josephson junction according to the second form of implementation.

FIG. 3 is a perspective view illustrating a modification of the Josephson junction according to the second form of implementation. As shown in FIG. 3, the Josephson junction, 8A, differs from the Josephson junction 8 as shown in FIG. 2 that a width $W_3$ of the electrically conductive ferromagnetic layer 12 of a thickness t is equal to the width $W_2$ of the high temperature superconductor layer 2. Since the other respects are identical to those of the Josephson junction 8, the repeated mention is omitted. This Josephson junction 8A like the Josephson junction 8 of the second form of implementation operates as an SNS type Josephson junction. Here, the width $W_3$ of the electrically conductive ferromagnetic layer 12 to the extent that its magnetic field acts on the high temperature superconductor layer 2, may be narrower than the width $W_2$ of the high temperature superconductor layer 2.

Next, a Josephson junction 10 according to a third form of implementation will be described.

Figure 4:
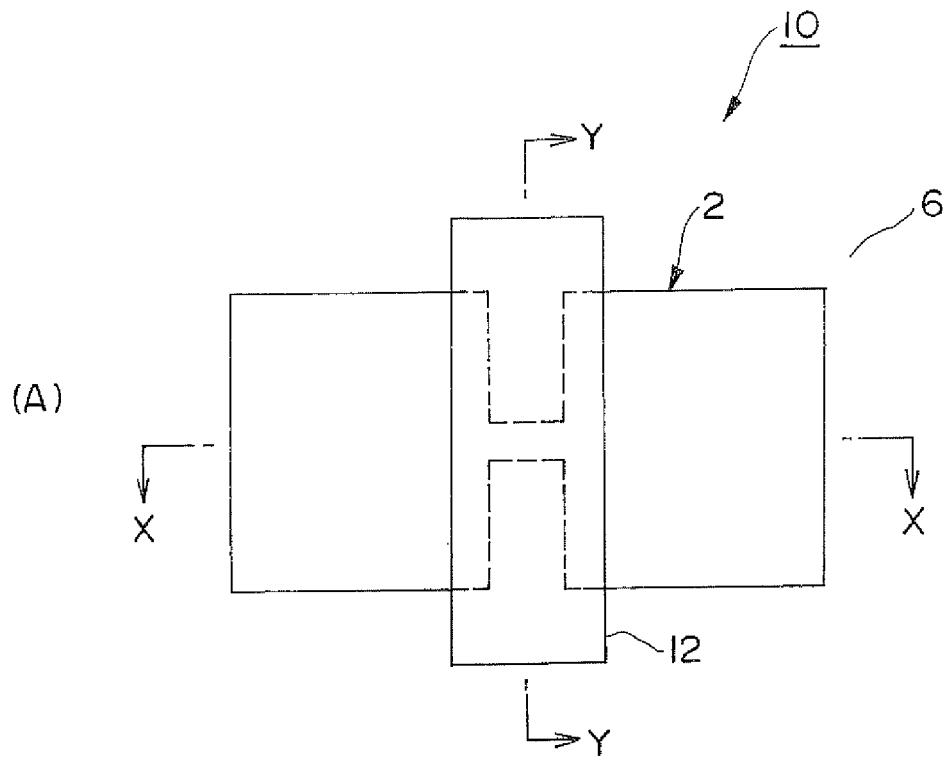
FIG. 4 diagrammatically illustrates a Josephson junction according to a third form of implementation of the present invention in which (A) is a plan view thereof, (B) is a cross sectional view taken along the line X-X in (A) and (C) is a cross sectional view taken along the line Y-Y in (A)
Figure 4:
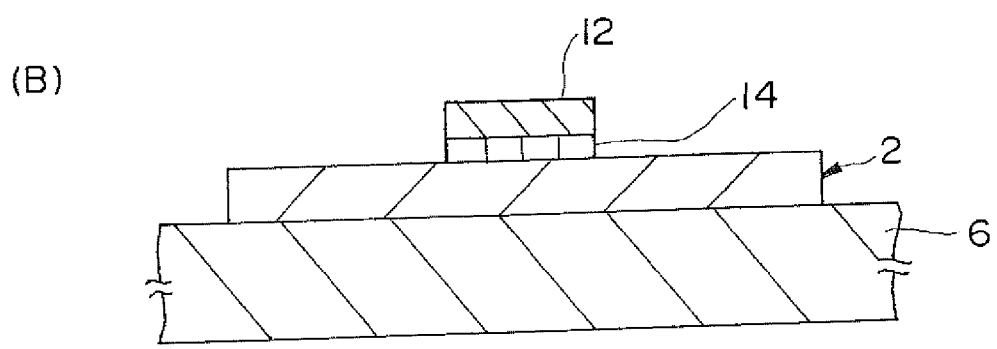
Figure 4:
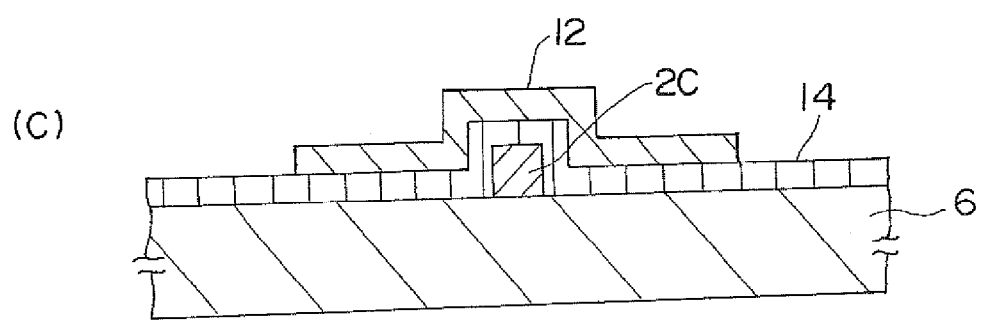

FIG. 4 diagrammatically illustrates a Josephson junction 10 according to a third form of implementation of the present invention in which (A) is a plan view thereof, (B) is a cross sectional view taken along the line X-X in (A) and (C) is a cross sectional view taken along the line Y-Y in (A). As shown in FIG. 4, the Josephson junction 10 differs from the Josephson junction 1 as shown in FIG. 1 that the ferromagnetic layer covering on the narrowed portion 2C of the high temperature superconductor layer 2 is an electrically conductive ferromagnetic layer 12 and that an insulator layer 14 is interposed between the electrically conductive ferromagnetic layer 12 and the high temperature superconductor layer 2. Since the other respects are identical to those of the Josephson junction 1, the repeated mention is omitted.

The insulator layer 14 is a layer interposed to electrically isolate the electrically conductive ferromagnetic layer 12 from the narrowed portion 2C of the high temperature superconductor layer 2. This insulator 14 which is not an insulator layer acted a tunnel layer may be any one that can simply perform the insulating function. The insulator layer 14 may have a thickness of, e.g., 10 nm, and may be a $Si_3N_4$ film or $SiO_2$ film.

While the structure in FIG. 4 is shown that the narrowed portion 2C of the high temperature superconductor layer 2 is covered via the insulator layer 14 with the electrically conductive ferromagnetic layer 12, the high temperature superconductor layer 2 may be formed on a surface having the electrically conductive ferromagnetic layer 12 and the insulator layer 14 laid thereon to construct an SIS type Josephson junction 10.

In the Josephson junction 10 according to the third form of implementation, the electrically conductive ferromagnetic layer 12 covered on the narrowed portion 2C of the high temperature superconducting layer 2 restrains the high temperature superconductor layer 2C. Since a transformation from superconductor to insulator is brought about in particular for the high temperature superconductor layer, there develops a barrier. Thus, a Josephson junction of this form of implementation like the Josephson junction of the first form of implementation operates as an SIS type Josephson junction.

Figure 5:
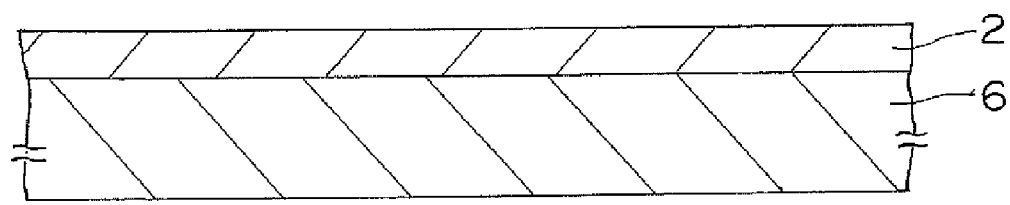
FIGS. 5(A)-(C) illustrates a manufacturing process for the Josephson junction according to the first form of implementation.
Figure 5:
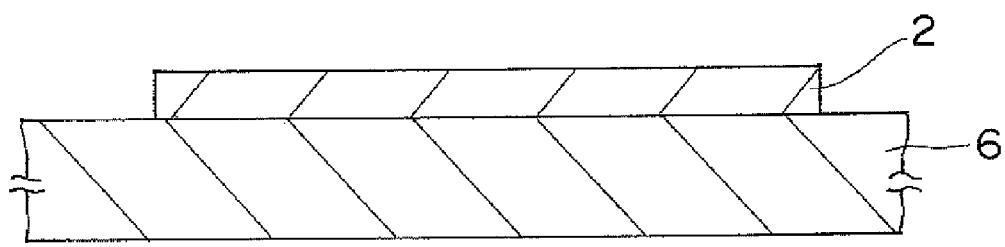
Figure 5:
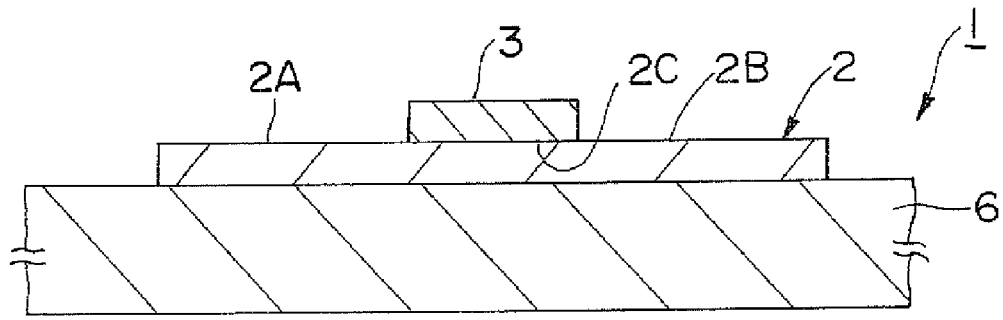

Here, a method of manufacturing a Josephson junction 1, 8, 8A of the present invention mention will be described with reference to FIG. 5. FIGS. 5(A)-(C) illustrates a manufacturing process for the Josephson junction according to the first form of implementation, which is shown on a cross sectional view corresponding to that taken along the line X-X in FIG. 1(A).

At the outset, a high temperature superconductor layer 2 is formed onto a substrate 6 as shown in FIG. 5(A). Though not shown, a buffer layer may be interposed at need between the substrate 6 and the high temperature superconductor layer 2. The substrate used may be composed of magnesium oxide (MgO), sapphire ($Al_2O_3$), $LaAlO_3$ consisting of La, Al and oxygen, $SrAlO_3$ consisting of Sr, Al and oxygen or the like.

Next, a desired pattern of a Josephson junction is formed on the high temperature superconductor layer 2 in a lithography step using a mask followed by an etching step as shown in FIG. 5(B).

As shown in FIG. 5(C), an insulating ferromagnetic layer 3 is formed on the high temperature superconductor layer 2. Next in a lithography step using a mask followed by an etching step, the insulating ferromagnetic layer 3 is patterned as desired to construct a Josephson junction 1. The insulating ferromagnetic layer 3 used may be composed of a material by one of various ferrites such as $Fe_3O_4$.

Here, if the insulating ferromagnetic layer 3 is substituted by an electrically conductive ferromagnetic layer 12, the Josephson junction 8, 8A can be formed. The electrically conductive ferromagnetic layer 12 used may be composed of a material such as iron (Fe), nickel (Ni), manganese (Mn) or chromium (Cr).

The forming at least three layers, i.e., a superconductor layer, an oxide layer as a tunnel layer and a superconductor layer was needed to fabricate the conventional SIS type Josephson junction. According to the manufacturing methods of the Josephson junctions 1, 8, 8A of the present invention, they can be manufactured by forming two layers, i.e., a high temperature superconductor layer 2 and an insulating ferromagnetic layer 3. Consequently, the oxide film as the tunnel layer needs not to be formed and the number of process steps can be reduced. Especially, when an insulating barrier layer was deposited onto a specially formed surface of the conventional copper oxide type high temperature superconductor, its clean surface had so far been necessarily destroyed. The Josephson junctions 1, 8, 8A can be manufactured without causing such damages. The feature in the manufacturing process of the Josephson junction 1 of the present invention is that it is not necessary to form an oxide layer as a tunnel layer in the prior art.

When the Josephson junctions 1, 8, 8A are manufactured by the method of the present invention as described, their reproducibility and controllability of electrical properties can be improved sharply.

Next, a method of manufacturing a Josephson junction 10 according to the third form of implementation of the present invention will be described.

FIG. 6(A)-(D) illustrates a manufacturing process for the Josephson junction 10 according to the third form of implementation, which is shown on a cross sectional view corresponding to that taken along the line X-X in FIG. 4(A).

Figure 6:
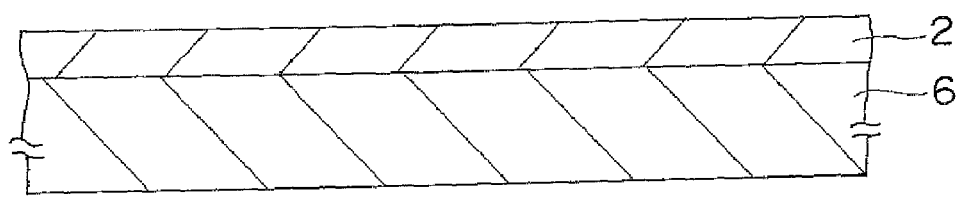
FIG. 6(A)-(D) illustrates a manufacturing process for the Josephson junction according to the third form of implementation.
Figure 6:
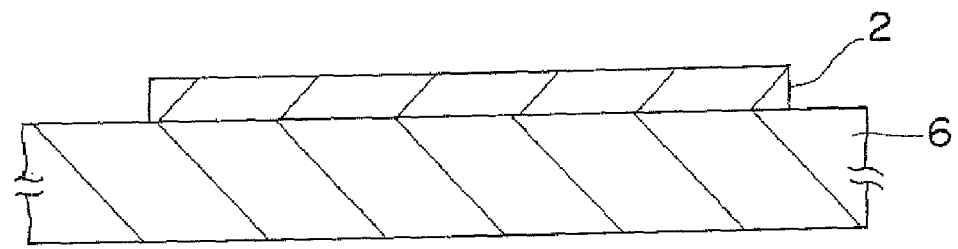
Figure 6:
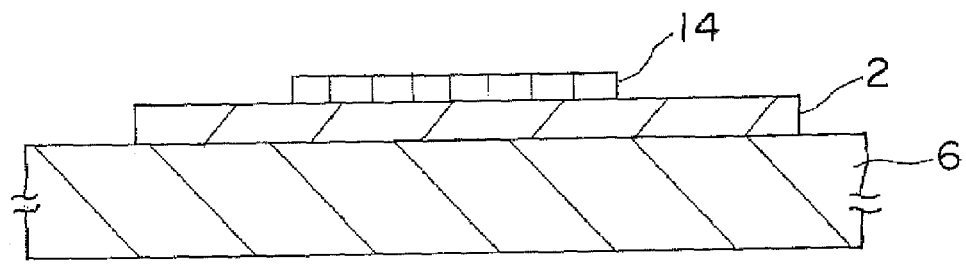
Figure 6:
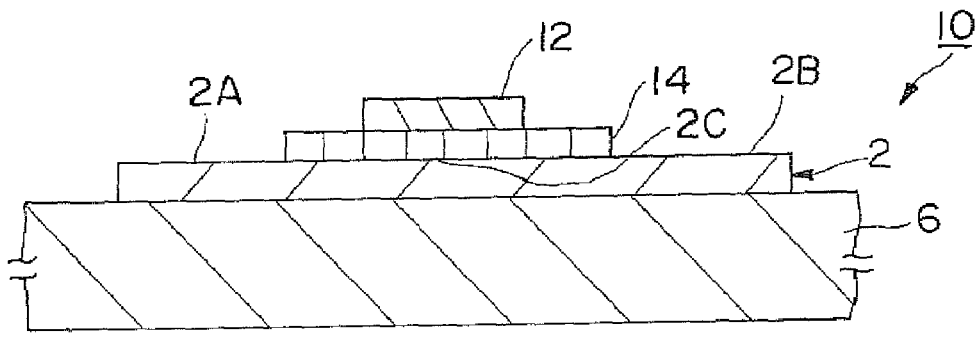

In the manufacture of the Josephson junction 10 according to the third form of implementation of the invention as in the manufacture process for the Josephson junction 1, after a pattern of the high temperature superconductor layer 2 is formed (see FIGS. 6(A) and 6(B)), a step of forming the insulating layer 14 of a desired shape is added as shown in FIG. 6(C). Next, as shown in FIG. 6(D) the electrically conductive ferromagnetic layer 12 substituted for the insulating ferromagnetic layer 3 may be formed on the insulating layer 14 so as to be of a desired shape. The electrically conductive ferromagnetic layer 12 used may be composed of a material such as iron (Fe), nickel (Ni), manganese (Mn) or chromium (Cr).

Since the insulating layer 14 is not the tunnel layer but merely acts to insulate the electrically conductive ferromagnetic layer 12, the high temperature superconductor layer 2 is not damaged when forming the insulating layer 14 according to the manufacturing process for the Josephson junction 10 of the present invention. Therefore, the reproducibility and controllability of electrical properties of the Josephson junction 10 can be improved sharply by using the method of making the Josephson junction 10 of the present invention The above mentioned high temperature superconductor layer 2, the insulating ferromagnetic layer 3, the electrically conductive ferromagnetic layer 12 and the insulating layer 14 may be formed by an ordinary thin film forming method such as sputtering, vapor deposition, laser ablation, CVD, MBE or the like. Also, a masking process using light exposure or electron beam exposure and a dry etching process may be used in forming a pattern of a desired configuration.

A Josephson device using a Josephson junction 1, 8, 8A, 10 of the present invention is described. Note that an explanation is given with a Josephson junction as shown in FIG. 1.

Figure 7:
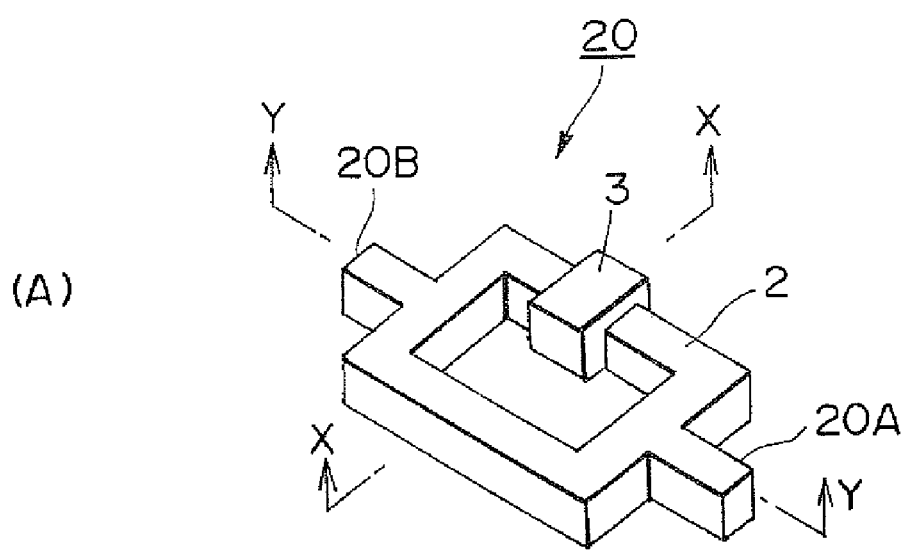
FIG. 7 diagrammatically illustrates a structure of a superconducting quantum interference device (SQUID) with a Josephson junction of the present invention in which (A) is a perspective view thereof and (B) is a cross sectional view taken along the line X-X in (A)
Figure 7:
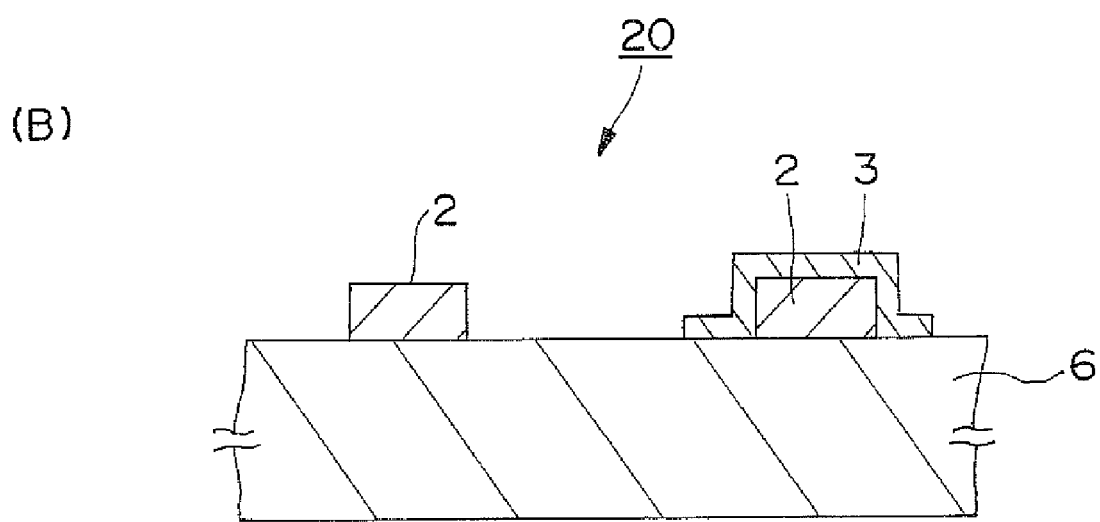

FIG. 7 diagrammatically illustrates a structure of a superconducting quantum interference device (hereinafter referred to conveniently as SQUID) using a Josephson junction 1 of the present invention in which (A) is a perspective view thereof and (B) is a cross sectional view taken along the line X-X in (A). As shown in FIG. 7, the superconducting quantum interference device 20 comprises a superconductor layer 2 in the form of a square ring having one side a middle part of which is covered with an insulating ferromagnetic layer 3 to form a Josephson junction 1. This device is called a RF-SQUID. Middle parts of two opposed sides in the Y-Y direction orthogonal to the X-X direction are provided with current terminals 20A and 20B, respectively. With current passed between the current terminals 20A and 20B, the superconducting quantum interference device 20 has a voltage, not zero, generated thereat when the current exceeds a certain threshold. This threshold current is called as the critical current. By utilizing the fact that the critical current varies as a function of the magnetic flux, the magnetic flux can be detected at high sensitivity from measurement of the critical current. While the Josephson junction 1 is used as shown in FIG. 7, it may be replaced by a Josephson junction 10 having the superconductor layer 12 covered with an insulating layer 14 and an electrically conductive ferromagnetic layer 12 or a Josephson junction 8, 8A having the superconductor layer 2 covered with the electrically conductive ferromagnetic layer 12.

Figure 8:
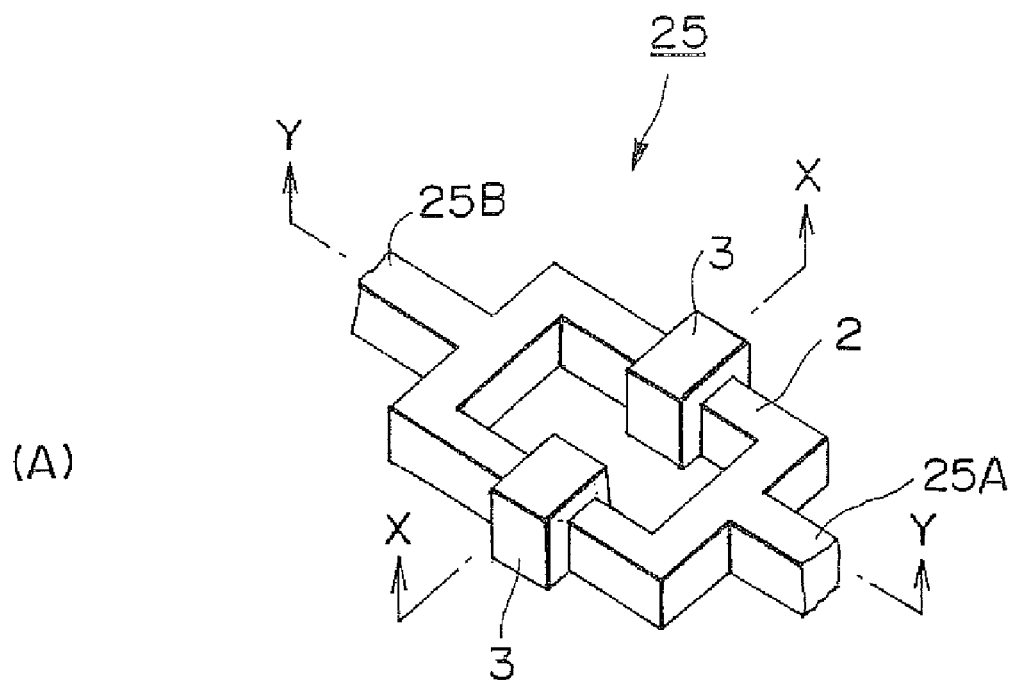
FIG. 8 diagrammatically illustrates a structure of another superconducting quantum interference device with a Josephson junction of the present invention in which (A) is a perspective view thereof and (B) is a cross sectional view taken along the line X-X in (A)
Figure 8:
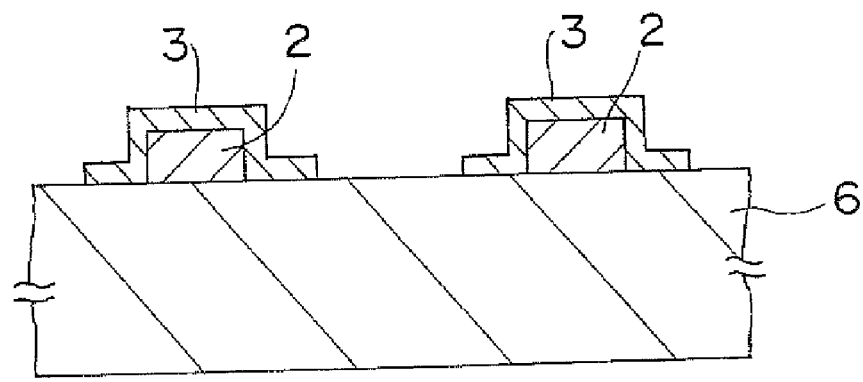

FIG. 8 diagrammatically illustrates a structure of another superconducting quantum interference device with a Josephson junction of the present invention in which (A) is a perspective view thereof and (B) is a cross sectional view taken along the line X-X in (A).

As shown in FIG. 8, the superconducting quantum interference device 25 comprises a superconductor layer 2 in the form of a square ring having two opposed sides in X-X direction middle parts of which are covered with an insulating ferromagnetic layer 3 to form two Josephson junctions 1. This device is called a DC-SQUID. Middle parts of the other two opposed sides in the Y-Y direction orthogonal to the X-X direction in the square ring are provided with current terminals 25A and 25B, respectively. While the Josephson junctions 1 are used as shown in FIG. 8, they may be replaced by Josephson junctions 10 or Josephson junctions 8, 8A. In the DC-SQUID, the magnetic flux can be detected too at high sensitivity from measurement of the critical current.

A single flux quantum device using Josephson junctions 1, 8, 8A, 10 of the present invention will be described.

Figure 9:
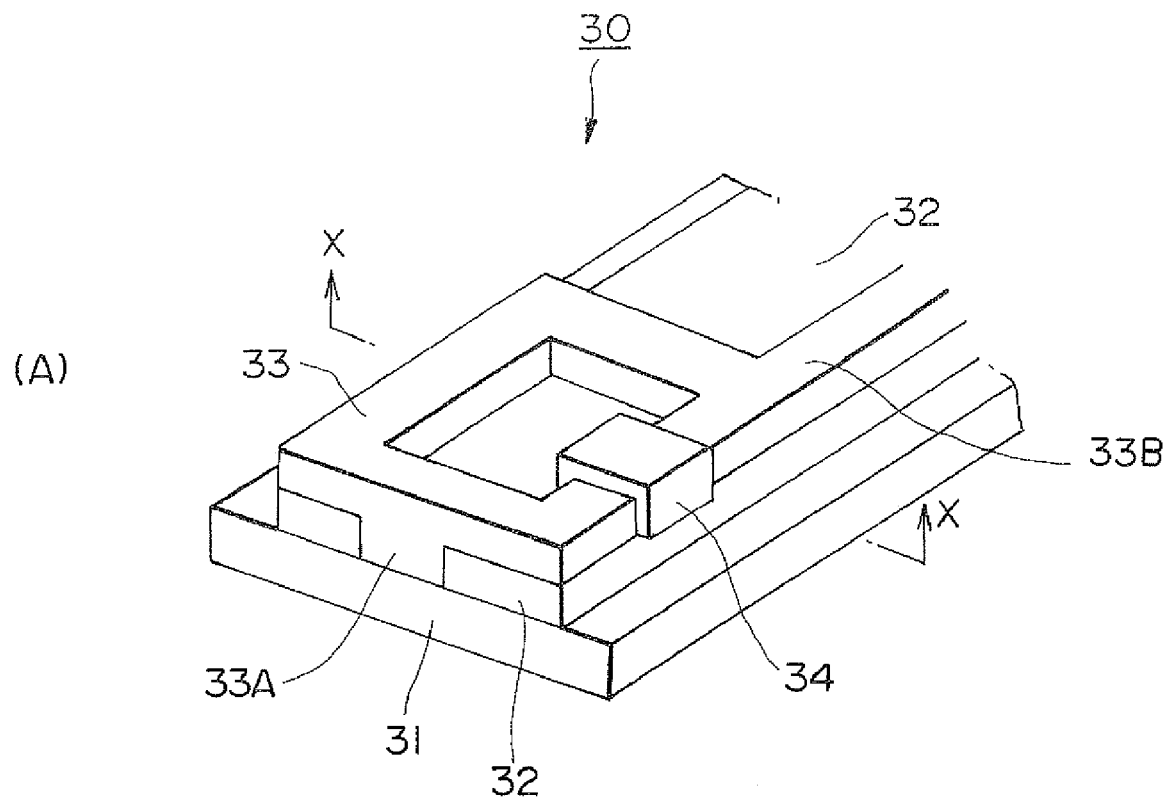
FIG. 9 diagrammatically illustrates a structure of a single flux quantum device with a Josephson junction of the present invention in which (A) is a partial perspective view thereof and (B) is a cross sectional view taken along the line X-X in (A)
Figure 9:
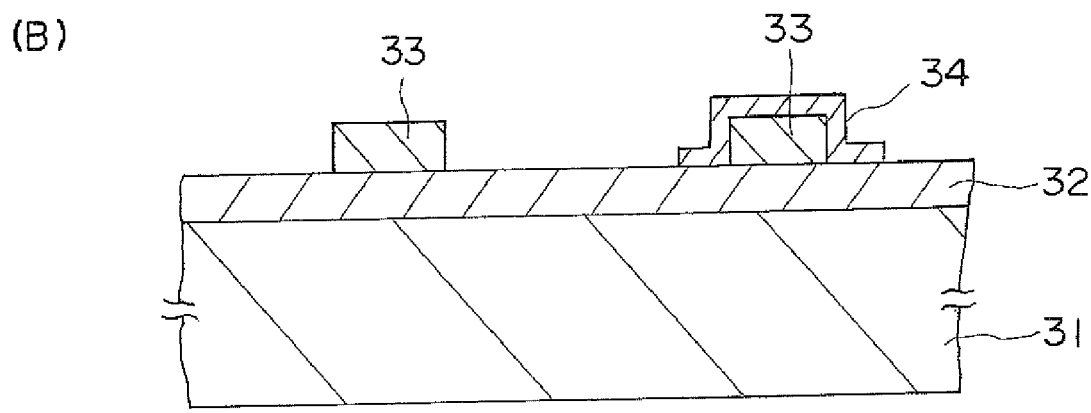

FIG. 9 diagrammatically illustrates a structure of a single flux quantum device with a Josephson junction 1 of the present invention in which (A) is a partial perspective view thereof and (B) is a cross sectional view taken along the line X-X in (A). As shown in FIG. 9, the single flux quantum device 30 comprises grounding layer 31, a superconductor layer 33 in the form of a square ring formed on a surface of an insulating layer 32 formed on the grounding layer. A Josephson junction 1 is formed where an insulating ferromagnetic layer 34 is covered in a middle part of one side of a square ring of a superconductor layer 33. This device constitutes the RF-SQUID as shown in FIG. 7. As is shown, the superconductor layer 33 has one end 33A connected to the grounding layer 31 and the other end 33B connected to another RF-SQUID (not shown) via an interconnection layer composed of superconductor.

Thus, with a single flux quantum device 30, a number of RF-SQUID can be integrated to construct a single flux quantum device IC (integrated circuit), namely a SFQ circuit. In the RF-SQUID, one quantized flux and 0 quantized flux are made to correspond to information 1 and information 0, respectively, when performing a logical operation. While the Josephson junction 1 is used in RF-SQUID of a single flux quantum device 30 in FIG. 9, it may be replaced by a Josephson junction 10 having an insulator layer 14 and an electrically conductive ferromagnetic layer 12 formed on a superconductor layer 2 or a Josephson junction 8, 8A having an electrically conductive ferromagnetic layer 12 formed on a superconductor layer 2. In forming the single flux quantum device 30, the RF-SQUID may be substituted by a DC-SQUID using two Josephson junctions 1.

According to single flux quantum devices each using a Josephson junction 1, 8, 8A, 10, an integrated circuit thereof can be made which operates at an ultrahigh speed and with an ultra power saving that excel the performance of a semiconductor CMOS device.

Figure 10:
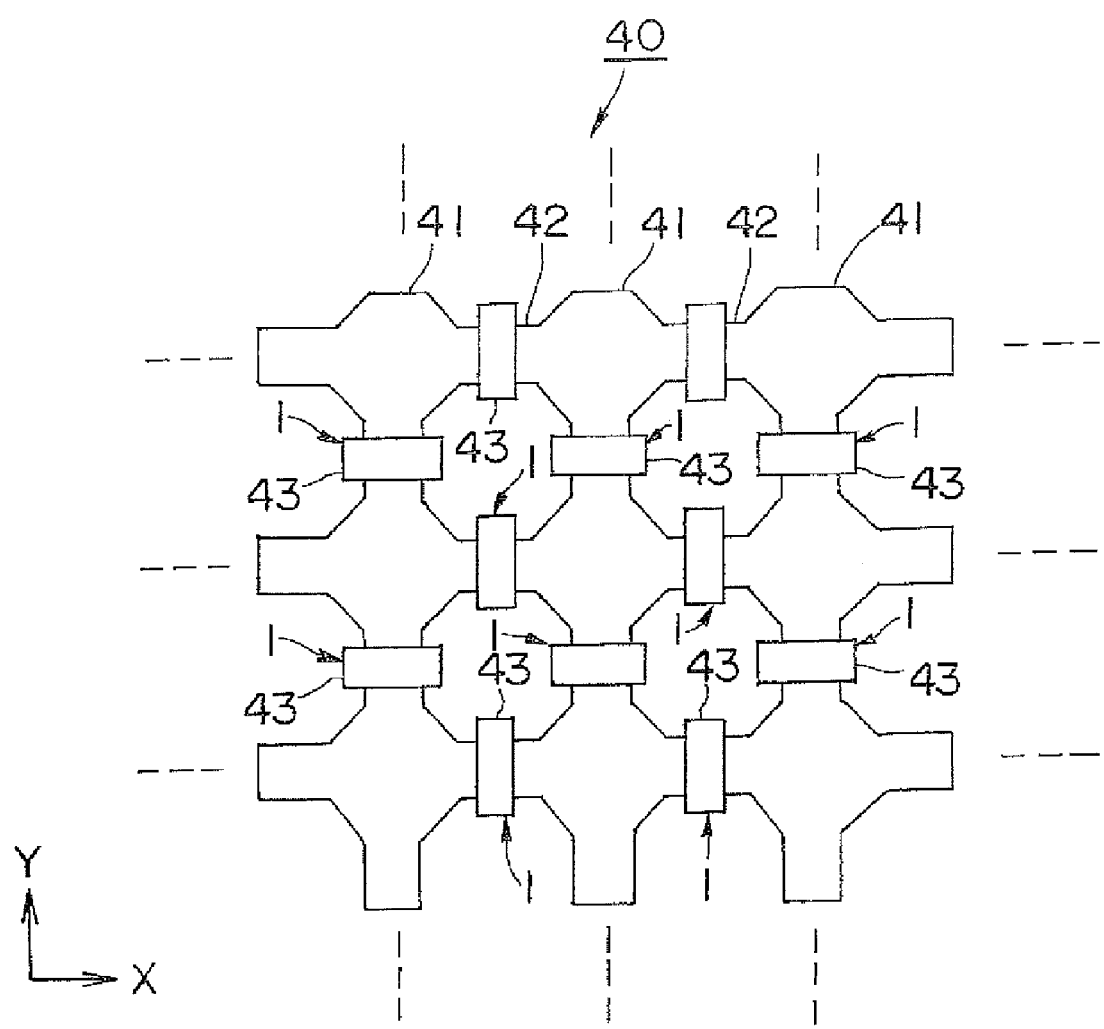
FIG. 10 is a plan view diagrammatically illustrating a typical structure of an array with Josephson junctions.

An array using Josephson junctions 1, 8, 8A, 10 according to the present invention will be described. FIGS. 10 to 13 are plan views diagrammatically illustrating typical structures of an array using Josephson junctions 1. As shown in FIG. 10, in the array 40 using Josephson junctions 1, a portion 41 having a form of a polygon and a narrowed portion 42 both of which are made of superconductor layer are interconnected and are arranged in the form of a matrix in an X-Y plane. The each narrowed portion 42 of superconductor layer that lies at each point of intersection of the matrix is covered with an insulating ferromagnetic layer 43 to form each Josephson junction 1. Thus, a number of Josephson junctions 1 are disposed at the points of intersection of the matrix, respectively, to construct the array.

Figure 11:
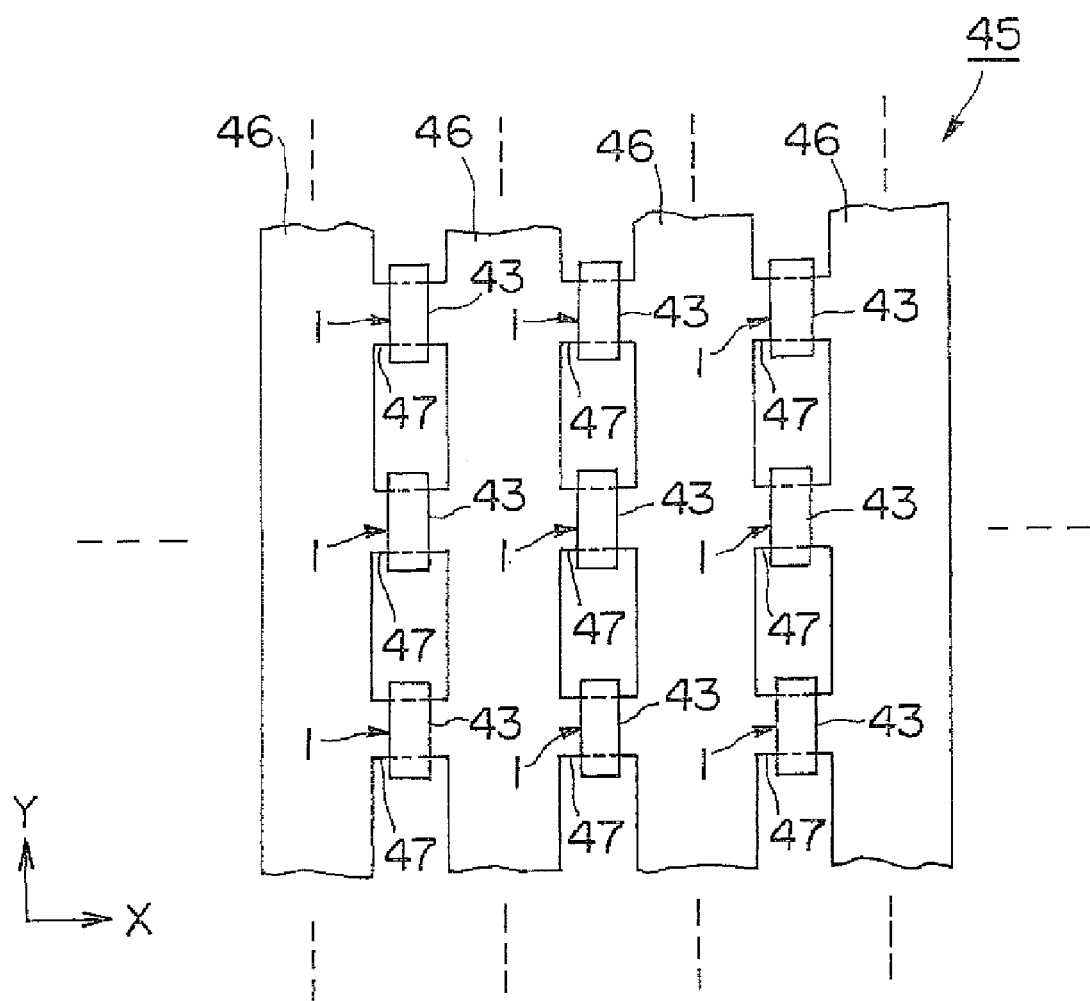
FIG. 11 is a plan view diagrammatically illustrating another structure of the array with Josephson junctions.

In an array 45 using Josephson junctions 1 as shown in FIG. 11, line shaped superconductor layers 46 (horizontal as shown) are disposed in X directions in columns, narrowed portions 47 made of superconductor layer are disposed with a predetermined space in Y directions in rows to interconnect these line shaped superconductor layers 46, and these are arranged in the form of a matrix in an X-Y plane. The narrowed portion 47 of superconductor layer that lies at each point of intersection of lines of the lattice is covered with an insulating ferromagnetic layer 43 to form each Josephson junction 1. Thus, a number of Josephson junctions 1 are disposed at the points of intersection of the lines of the matrix, respectively, to construct the array.

Figure 12:
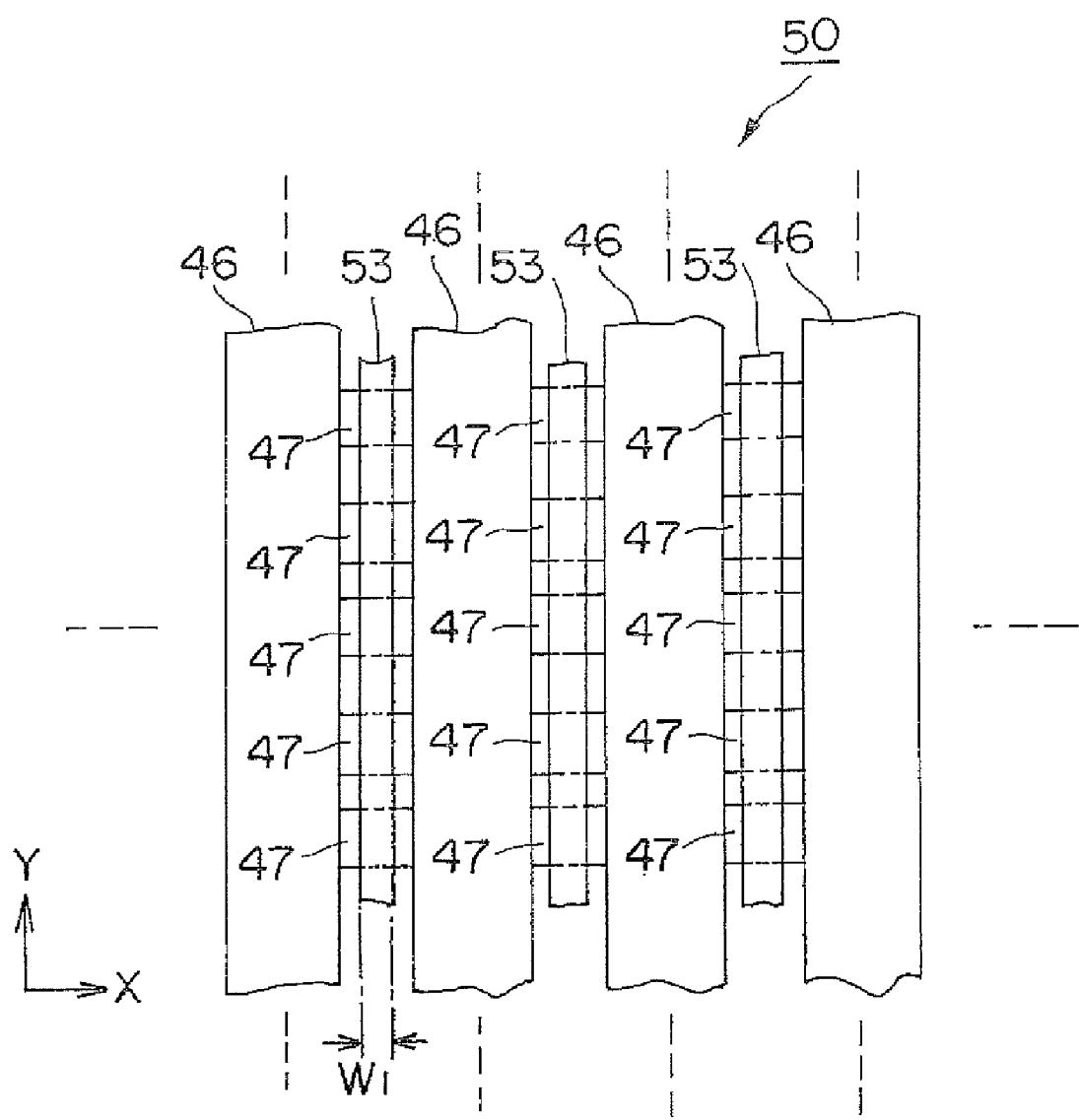
FIG. 12 is a plan view diagrammatically illustrating a further structure of the array with Josephson junctions.
Figure 13:
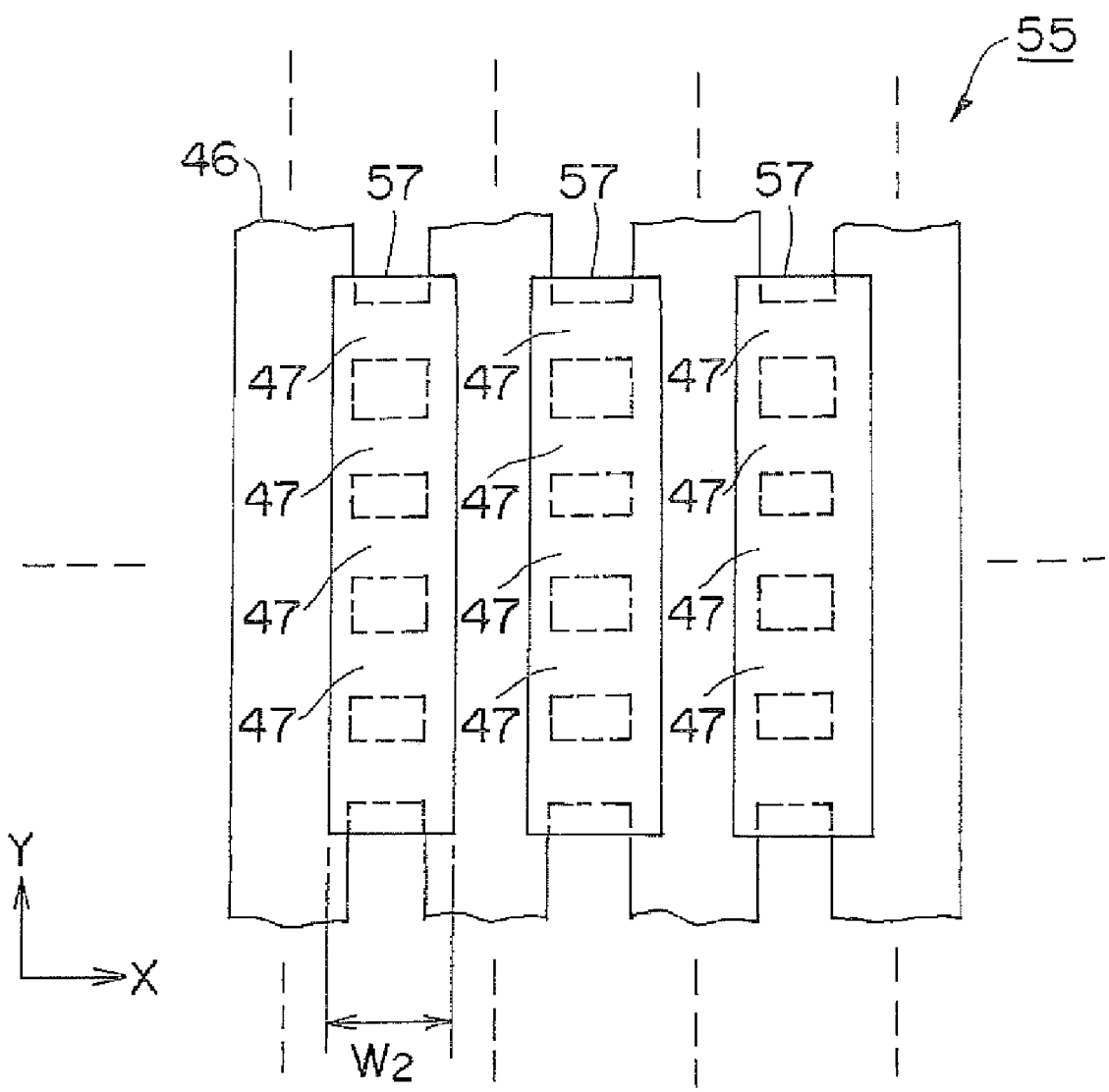
FIG. 13 is a plan view diagrammatically illustrating a yet further structure of the array with Josephson junctions.

Arrays 50 and 55 using Josephson junctions 1 as shown in FIGS. 12 and 13 are identical in structure of superconductor layer to the array 45 shown in FIG. 11 and differ from the latter in that the narrowed portions 47 are covered with line shaped insulating ferromagnetic layers 53. In the array shown in FIG. 12, the insulating ferromagnetic layers 53 have a width $W_1$ that is made narrower than that of the narrowed portions 47. In the array shown in FIG. 13, the insulating ferromagnetic layers 57 have a width $W_2$ that is made wider than that of the narrowed portions 47.

While the Josephson junctions 1 are used in each of the arrays 40, 45, 50 and 55, they may be replaced by Josephson junctions 10 having the super conductor layers 41, 46 covered with insulating layers 14 and electrically conductive ferromagnetic layers 12 in place of the insulating ferromagnetic layers 43, 53, 57 or by Josephson junctions 8, 8A having the superconducting layers 2 covered with electrically conductive ferromagnetic layers 12 in place of the insulating ferromagnetic layers 43, 53, 57.

According to an array 40, 45, 50, 55 using Josephson junctions 1 of the present invention, the array can be utilized as a photon generator or detector over an extensive dynamic range from millimeter waves to far infrared waves.

In the present invention, it should be noted that the "Josephson device" is intended to include a photon generator or detector with a Josephson junction sole body over an extensive dynamic range from millimeter waves to far infrared waves, a superconducting quantum interference device using a Josephson junction and a variety of integrated circuits such as an SFQ circuit using Josephson junctions.

The Josephson junctions 1, 8, 8A, and 10 according to the present invention is simple in structure and easy to manufacture as mentioned in connection with the manufacturing method above. Accordingly, the array and the integrated circuit, each using a plurality of Josephson junctions 1, 8, 8A, 10 can be manufactured at an enhanced yield. Since the manufacturing method is simple, it is possible to diminish the fluctuations of electrical properties on individual Josephson junctions 1, 8, 8A, 10 that constitute an array or an integrated circuit. Thus, it is possible to manufacture the individual Josephson junctions 1, 8, 8A, 10 having even in $I_c R_N$ product.

Example

An Example of the Josephson junction according to the present invention will be described in detail below.

FIGS. 14(A) to 14(K) illustrate a manufacturing process of making a Josephson junction 8 in the Example in cross sectional views.

Figure 14:
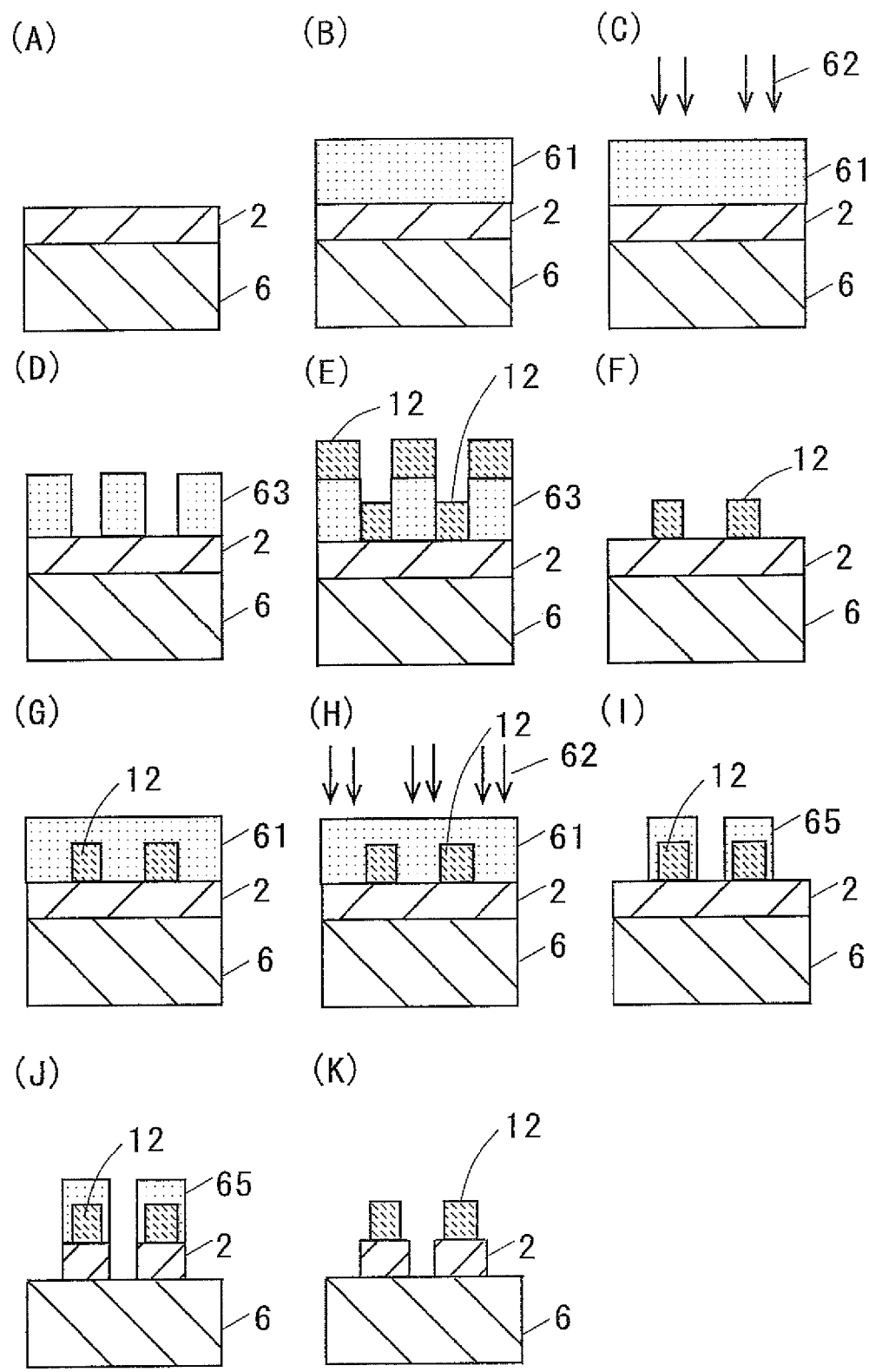
FIG. 14 illustrates a manufacturing process of making a Josephson junction in an Example in cross sectional views.

As shown in FIG. 14(A), a superconductor layer 2 consisting of $La_{2-x}Sr_xCuO_4$ and having a film thickness of about 40 to 80 nm was deposited onto a LaSrAlO$_4$ (LSAO) substrate 6 by ablation method using a pulsed laser (PLD method) to be described later. Then, a positive type resist 61 for electron beam exposure (made by Shipley Inc., model 1813) is coated onto the $La_{2-x}Sr_xCuO_4$ superconductor layer 2 as shown in FIG. 14(B). An electron beam exposure 62 was carried out as shown in FIG. 14(C). A resist pattern 63 that was opened in an area where a ferromagnetic layer 12 is to be disposed was formed by the development (see FIG. 14(D)).

As shown in FIG. 14(E), iron to become the ferromagnetic layer 12 was deposited to the thickness of 50 to 150 nm onto an entire surface of the substrate 6 having the resist pattern 63 by vapor deposition method using resistance heating (degree of vacuum of about $4 \times 10^{-6}$ torr). A pattern of ferromagnetic layer 12 was formed on the superconductor layer 12 by etching the resist pattern 63 (see FIG. 14(F)). This process is so-called a lift-off process that an excess of ferromagnetic layer was removed.

The followings are steps to remove an excess of superconductor layer 2 by etching.

A resist 61 for electron beam exposure was coated as shown in FIG. 14(G) and the resists 61 was exposed to electron beam as shown in FIG. 14(H). A pattern 65 to etch the superconductor layer 2 was formed by the development of resist for electron beam exposure as shown in FIG. 14(I). Then, an excess superconductor layer 2 was etched by using the pattern 65 as a mask as shown in FIG. 14(J). Finally, the etching pattern 65 was removed, thus fabricating a Josephson junction in the Example. Note that the pattern used in making the Josephson junction 8 includes a four-terminal pattern for evaluation of the electric resistance property of the Josephson junction 8.

Figure 15:
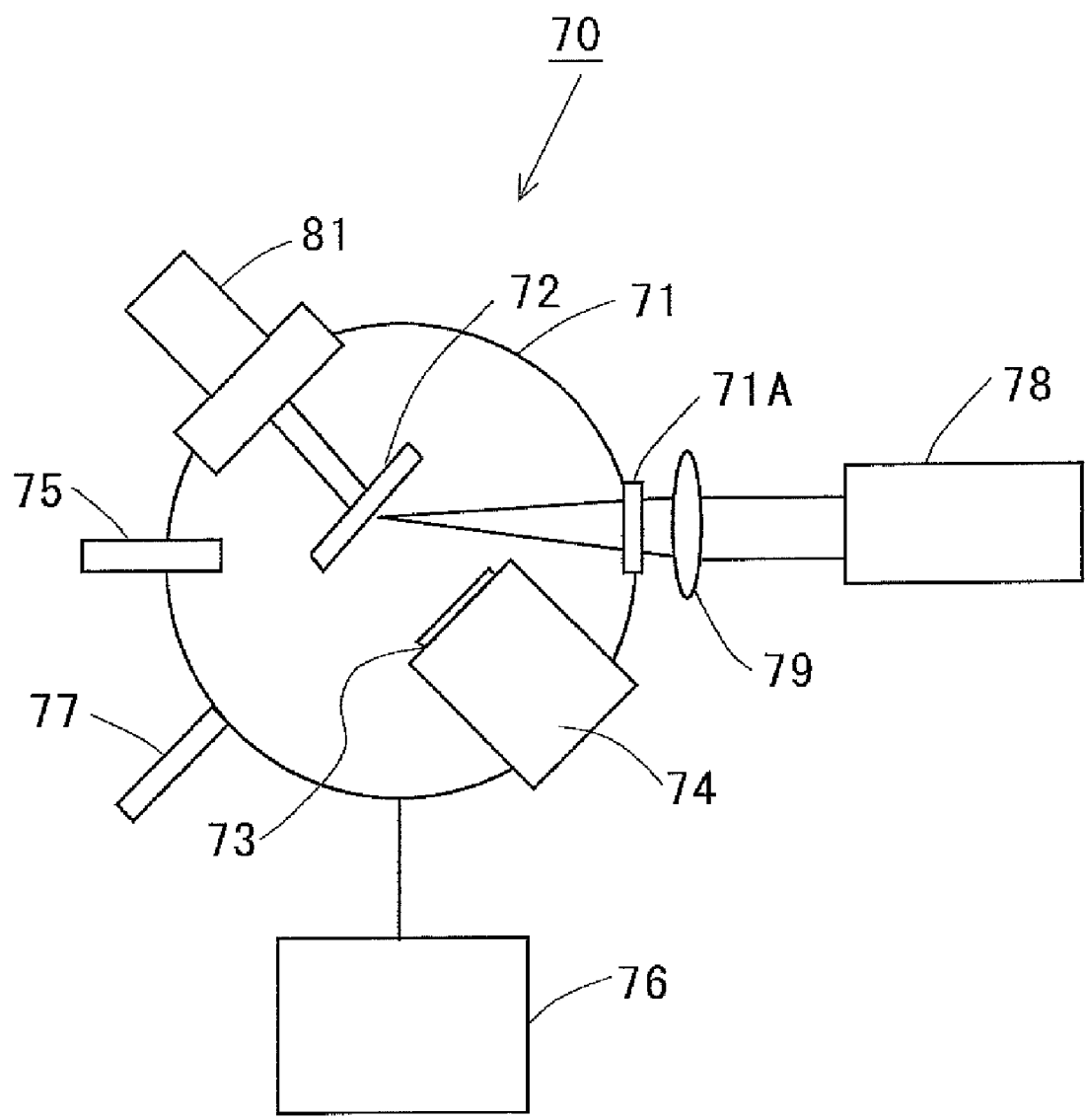
FIG. 15 is a diagrammatic view illustrating an apparatus using a pulsed laser ablation method.

FIG. 15 is a diagrammatic view illustrating an apparatus using a pulsed laser ablation method. As shown in FIG. 15, main components of the pulsed laser ablation apparatus 70 includes a vacuum chamber 71, a target 72 containing a superconductor material and a substrate holder 74 retaining a substrate 73, both of which are disposed in the vacuum chamber 71, a vacuum gage 75, an evacuator 76 for the vacuum chamber 71, an oxygen gas inlet 77 for the vacuum chamber 71 and a pulse laser 78 disposed outside of the vacuum chamber 71. Light from the pulsed laser 78 passes through a lens 79 and a window 71A of quartz glass or the like provided for the vacuum chamber 71 and is applied onto the target 72. Further, there may be provided a target rotator 81 for rotating the target 72.

In the pulsed laser ablation apparatus 70, the substrate 73 is mounted to the substrate holder 74. After a given degree of vacuum is reached, the target 72 is irradiated with the pulsed laser 78 while the oxygen gas as a raw material of the superconductor is supplied. A superconductor layer is deposited onto the substrate 73 from evaporated materials from the target 72 heated by the pulsed laser 78 and from oxygen. The KrF excimer laser having a wavelength of 248 nm was used as the pulsed laser 78.

Films of $La_{2-x}Sr_xCuO_4$ having different composition x were obtained by the above-mentioned pulsed laser ablation apparatus 70. Crystallographic and superconducting properties of the superconducting layer where x is 0.15 and 0.2 will be described.

Figure 16:
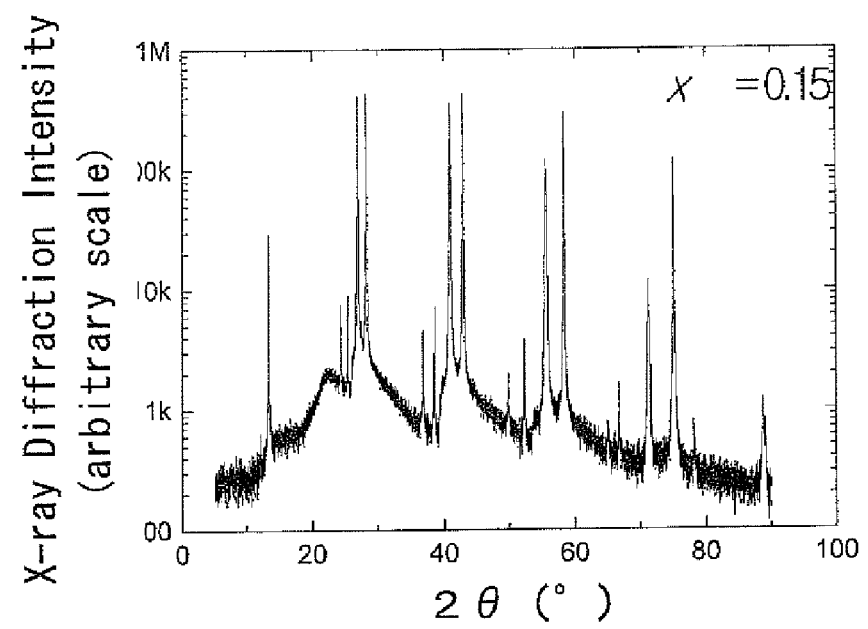
FIG. 16 illustrates X-ray diffraction patterns of a $La_{2-x}Sr_xCuO_4$ film deposited using the pulsed laser ablation method in the Example, showing a graph in (A) where Sr composition variable x is 0.15 and a graph in (B) where Sr composition variable x is 0.2.
Figure 16:
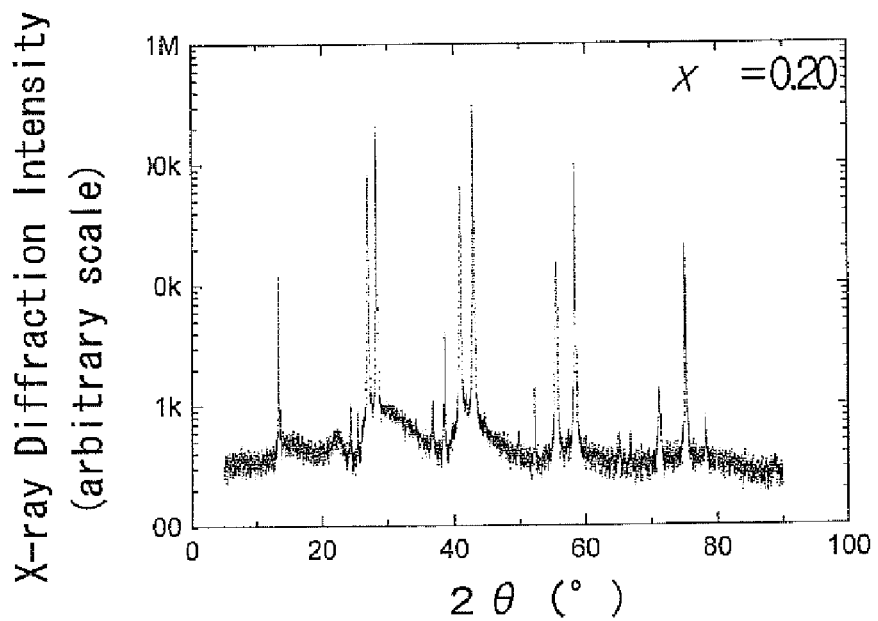

FIG. 16 illustrates graphically X-ray diffraction patterns of a $La_{2-x}Sr_xCuO_4$ film deposited by using the pulsed laser ablation method in the Example, showing a graph in (A) where Sr composition x is 0.15 and a graph in (B) where Sr composition x is 0.2. The ordinate axis of the graphs in FIG. 16 represents the X-ray diffraction intensity (in an arbitrary scale) and their abscissa axis represents the angle 2θ (°), i.e., the angle corresponding to twice the angle θ at which the X-ray is incident on the atomic plane.

As is apparent from FIG. 16, it has been found that sharp peaks in X-ray diffraction intensity are observed for each of the prepared $La_{2-x}Sr_xCuO_4$ films, namely those of $La_{1.85}Sr_{0.15}CuO_4$ (see FIG. 16(A)) and $La_{1.8}Sr_{0.2}CuO_4$ (FIG. 16(B)) and that phases of superconductors having good crystal qualities are obtained.

Figure 17:
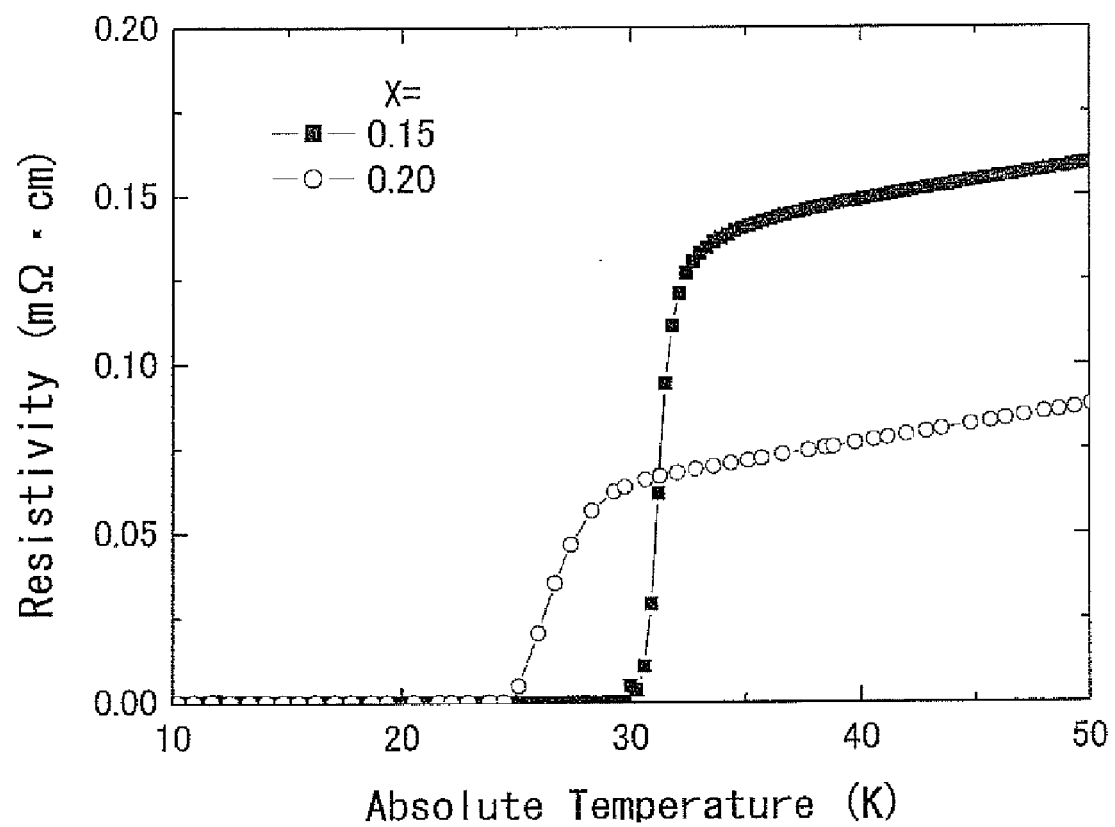
FIG. 17 is a graph illustrating results of investigation of a temperature dependence of resistivity of a film of $La_{2-x}Sr_xCuO_4$ where x=0.15 and 0.2 which is deposited using the pulsed laser ablation method in the Example.

FIG. 17 is a graph illustrating results of investigation of a temperature dependence of resistivity of films of $La_{2-x}Sr_xCuO_4$ (x=0.15 and 0.2) deposited by using the pulsed laser ablation method in the Example. In the graph of FIG. 17, the ordinate axis represents the resistivity (mΩ·cm) and the abscissa axis represents the absolute temperature (K).

As is apparent from FIG. 17, it has been found that a layer of superconductor of $La_{1.85}Sr_{0.15}CuO_4$ where composition x is 0.15 has a critical temperature of about 30 K and a layer of superconductor of $La_{1.8}Sr_{0.2}CuO_4$ where composition x is 0.2 has a critical temperature of about 25 K.

Comparative Example

In comparison with the Example, what was devoid of the ferromagnetic layer was prepared in the manner which is otherwise the same as the Example. In the Comparative Example, a superconductor layer made up of a thin wire is used.

Figure 18:
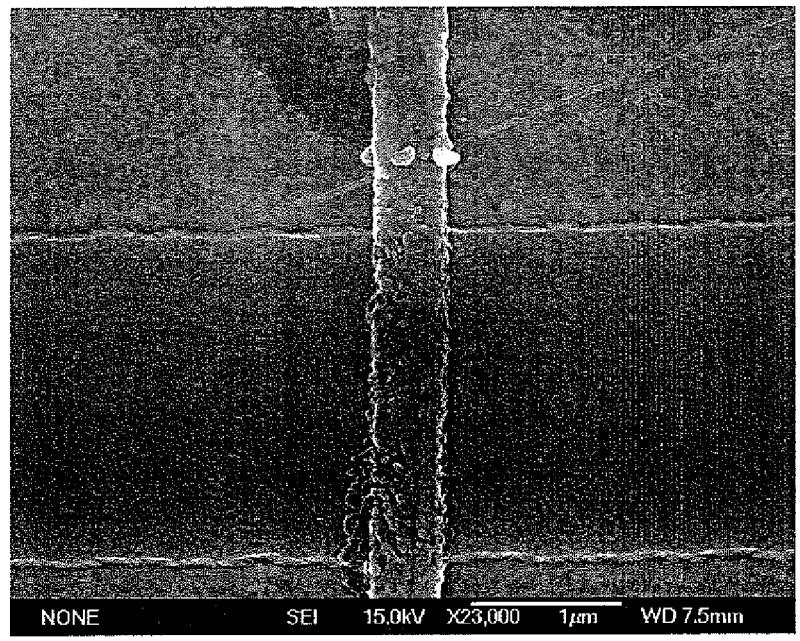
FIG. 18 shows in (A) a scanning electron microscopic image on observation of the Josephson junction in the Example and in (B) an explanatory view of (A)
Figure 18:
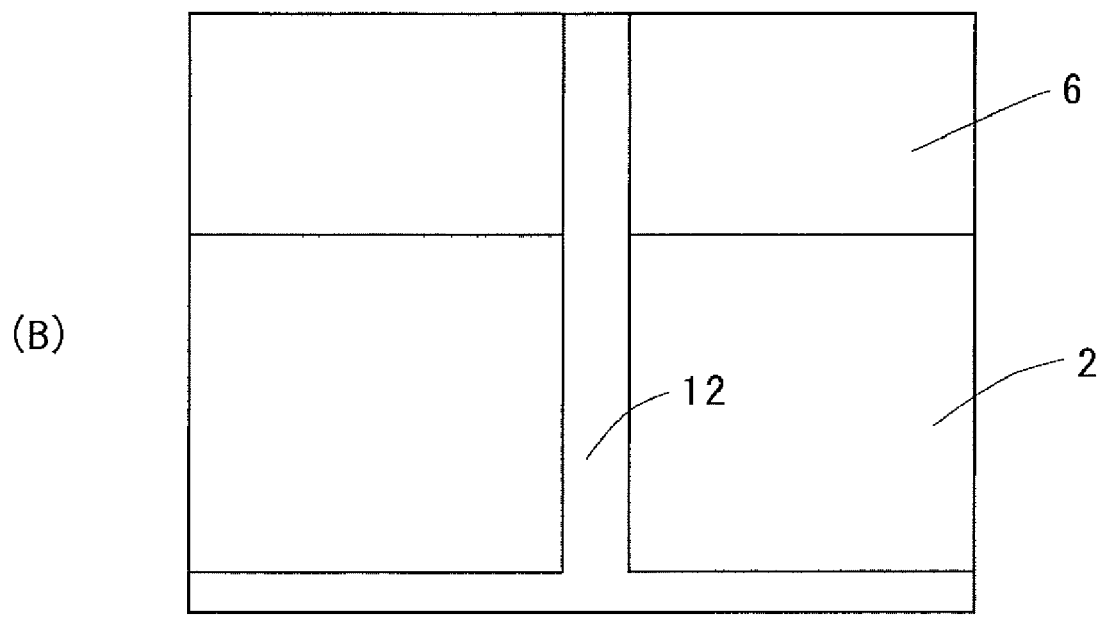

FIG. 18 shows in (A) a scanning electron microscopic image on observation of the Josephson junction in the Example and in (B) an explanatory view of (A). Electron beam had an acceleration voltage of 15 kV and the magnification was 23000. As is apparent from FIG. 18, it has been found that the superconductor layer 2 has a width of 2 μm and an electrically conductive ferromagnetic layer 12 formed on the superconductor layer 2 has a width of 400 nm (0.4 μm).

The electrical properties of a Josephson junction 8 prepared in the Example will be described. The electric resistance properties of the prepared Josephson junction 8 were measured using the DC four-terminal method. All the measurements below were made in a liquid helium cryostat.

Figure 19:
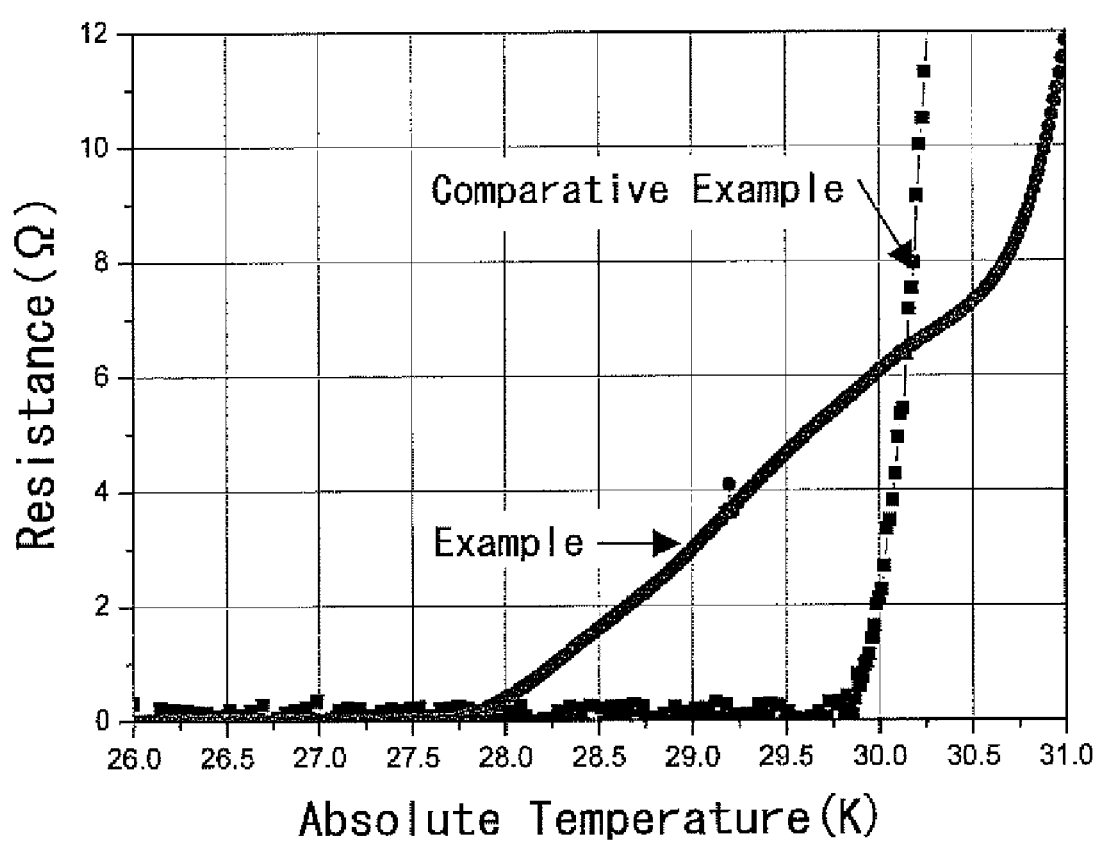
FIG. 19 is a graph illustrating results of measuring a temperature dependence of electric resistance of the Josephson junction in the Example.

FIG. 19 is a graph illustrating results of measuring a temperature dependence of electric resistance of the Josephson junction 8 in the Example. In the graph shown in FIG. 19, the ordinate axis represents the resistance (Ω) and the abscissa axis represents the absolute temperature (K). The result of the Comparative Example is also included. The superconductor layer 2 used was composed of $La_{1.85}Sr_{0.15}CuO_4$.

As is apparent from FIG. 19, it has been found that whereas the superconductor layer in the Comparative Example had zero resistance at 29.7 K, the Josephson junction 8 in the Example had zero resistance at 27.7 K, showing a drop in critical temperature, the temperature at which superconductance occurs. This is apparently because the electrically conductive ferromagnetic layer 12 included in the Josephson junction 8 causes lowering the critical temperature of the superconductor layer 2 beneath the electrically conductive ferromagnetic layer 12 in the Example.

Figure 20:
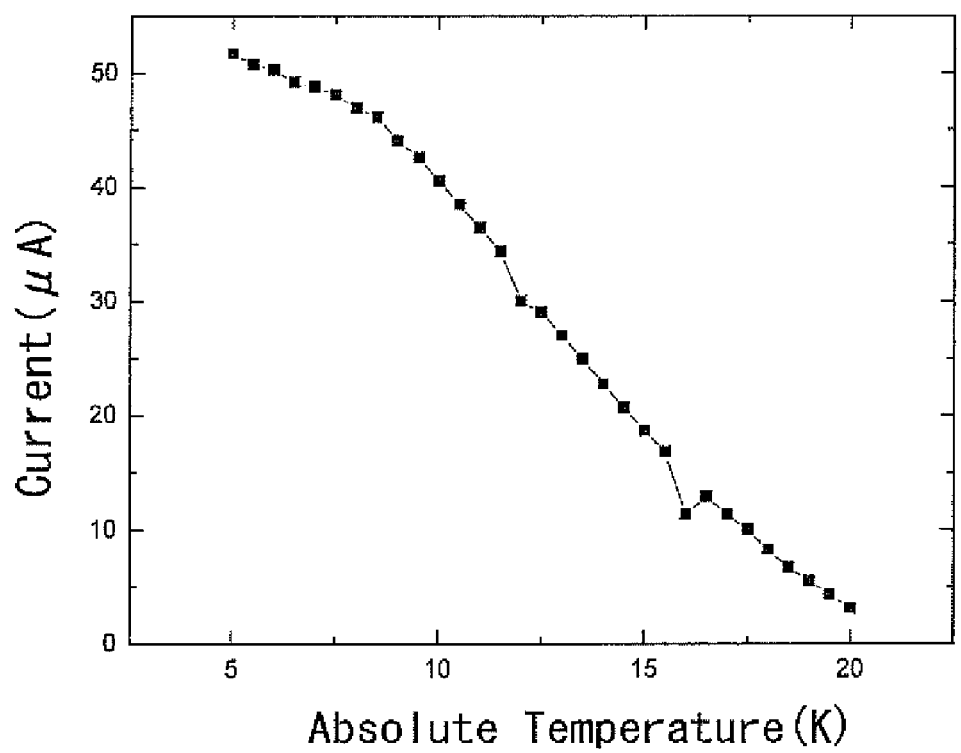
FIG. 20 is a graph illustrating results of measuring a temperature dependence of electric current flowing through the Josephson junction in the Example.

FIG. 20 is a graph illustrating results of measuring a temperature dependence of electric current flowing through the Josephson junction 8 in the Example. In the graph shown in FIG. 20, the ordinate axis represents the electric current (μA) and the abscissa axis represents the absolute temperature (K). As is apparent from FIG. 20, it has been found that the critical current passing through the Josephson junction 8 in the Example increases linearly as the temperatures falls. This shows the property characteristic of a Josephson junction that at lower temperatures it gradually approaches a definite value.

In order to verify explicitly that the Josephson junction 8 in the Example is an intrinsic Josephson junction, the junction was irradiated with externally generated microwave to measure its DC voltage-current characteristic. For irradiation, the microwave was guided very close to the Josephson junction housed in a liquid helium cryostat by using a coaxial cable. The irradiation power was 1 mW (0 dBm) and the measuring temperature was 8.7 K.

Figure 21:
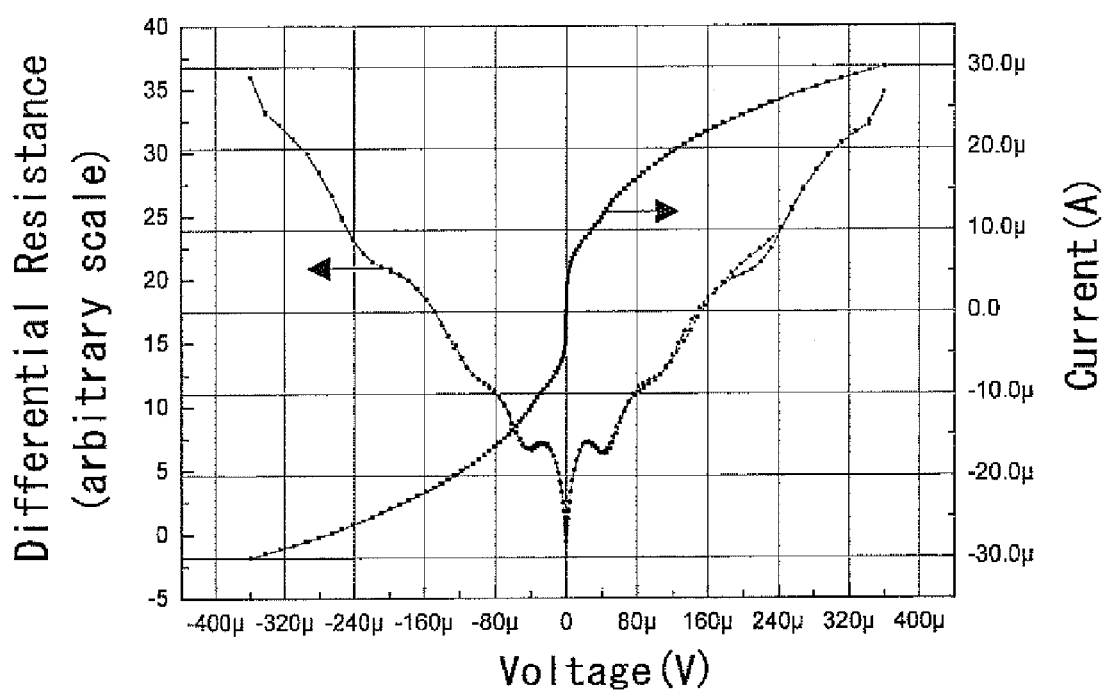
FIG. 21 is a graph illustrating results of measuring current-voltage characteristic and differential resistance on irradiating the Josephson junction in the Example with microwave of 10 GHz.

FIG. 21 is a graph illustrating results of measuring current-voltage characteristic and differential resistance on irradiating the Josephson junction 8 in the Example with microwave of 10 GHz. In the graph shown in FIG. 21, the abscissa axis represents the voltage (V) applied to the Josephson junction, the right ordinate axis represents the electric current (A) and the left ordinate axis represents the differential resistance (dV/dI in an arbitrary scale). As is apparent from FIG. 21, the current passing through the Josephson junction 8 in the Example showed a kink gently sloping in the differential resistance at every interval of 20 μV.

The Schapiro's step as an effect of interference that a Josephson junction exhibits is expressed by equation (1) stated below.

$$V = hf/(2e) = \Phi f \quad (1)$$

where V is the Schapiro's step spacing voltage (V), h is the Planck's constant ($6.626 \times 10^{-34}$ Js), e is the electron unit charge ($1.602 \times 10^{-19}$ C) and $\Phi(hf/(2e))$ is the flux quantum. When microwave of 10 GHz was applied, the Shapiro's step spacing was calculated to be 20 μV from the equation (1). It has thus been found that the step spacing of such kinks as observed in the Example satisfies the equation (1), and the Schapiro's step as an interference effect of the Josephson junction 8 was shown to be observed.

The Example indicates that it is possible to make it implementable to obtain a Josephson junction of what is called the bridge structure that a ferromagnetic layer is disposed on a part of the superconductor layer 2 in a simple manufacturing process.

The present invention should be understood not to be limited to the forms of implementation described in the foregoing but to allow various modifications thereof within the scope of the invention. For example, the ferromagnetic layer 3, 12 and the superconductor layer 2 can be sized suitably so that a desired $I_cR_N$ product may be obtained, which, needless to say, is within the scope of the present invention.

What is claimed is:

1. A Josephson junction comprising:
   a substrate;
   a high temperature superconductor layer having a crystal structure formed on said substrate; and
   a ferromagnetic layer formed on a middle part of said high temperature superconductor layer,
   wherein a width of said high temperature superconductor layer at the middle part is less than a Josephson penetration length, and the ferromagnetic layer is transforming at least a portion of the high temperature superconductor layer at the middle part thereof to insulator so as to form a Josephson junction.

2. The Josephson junction as set forth in claim 1, wherein said ferromagnetic layer is made of one of an electrically conductive ferromagnetic layer and an insulating ferromagnetic layer.

3. The Josephson junction as set forth in claim 1, further comprising an insulating layer between said high temperature superconductor layer and said ferromagnetic layer, wherein said insulating layer does not function as a tunnel layer on a middle part of said high temperature superconductor layer.

4. The Josephson junction as set forth in claim 1, wherein the middle part of said high temperature superconductor layer has a width substantially equal to a coherence length of said high temperature superconductor layer.

5. The Josephson junction as set forth in claim 1, the middle part and its both sides of said high temperature superconductor layer each have a width substantially equal to a coherence length of said high temperature superconductor layer.

6. A Josephson device comprising said Josephson junction as set forth in claim 1.

7. The Josephson junction as set forth in claim 1, wherein said high temperature superconductor layer is made of an oxide superconductor.

8. The Josephson junction as set forth in claim 7, wherein said oxide superconductor is one of a compound including La, Sr, Cu and O (LSCO), a compound including Y, Ba, Cu and O (YBCO), and a compound including Bi, Sr, Ca, Cu and O (BSCCO).

9. The Josephson junction as set forth in claim 1, wherein said ferromagnetic layer is made of one of a ferrite, iron (Fe), nickel (Ni), manganese (Mn) and chromium (Cr).

10. The Josephson junction as set forth in claim 1, wherein said substrate is made of one of magnesium oxide (MgO), sapphire ($Al_2O_3$), $LaAlO_3$, and $SrAlO_3$.

11. A Josephson junction comprising:
a substrate;
a high temperature superconductor layer having a crystal structure formed on said substrate; and
a ferromagnetic layer formed on a middle part of said high temperature superconductor layer,
wherein a width of at least part of said middle part of said high temperature superconductor layer is narrower than a width of both sides of said high temperature superconductor layer serving as electrodes, and
wherein the width of said at least part of the middle part of said high temperature superconductor layer is less than a Josephson penetration length, and the ferromagnetic layer is transforming at least a portion of the high temperature superconductor layer at the middle part thereof to insulator so as to form a Josephson junction.

12. The Josephson junction as set forth in claim 11, wherein said ferromagnetic layer is one of an electrically conductive ferromagnetic layer and an insulating ferromagnetic layer.

13. The Josephson junction as set forth in claim 11, further comprising an insulating layer between said high temperature superconductor layer and said ferromagnetic layer, wherein said insulating layer does not function as a tunnel layer on the middle part of said high temperature superconductor layer.

14. The Josephson junction as set forth in claim 11, wherein the width of said at least part of the middle part of said high temperature superconductor layer is substantially equal to a coherence length of said high temperature superconductor layer.

15. The Josephson junction as set forth in claim 11, wherein said high temperature superconductor layer is made of an oxide superconductor.

16. The Josephson junction as set forth in claim 15, wherein said oxide superconductor is one of a compound including La, Sr, Cu and O (LSCO), a compound including Y, Ba, Cu and O (YBCO), and a compound including Bi, Sr, Ca, Cu and O (BSCCO).

17. The Josephson junction as set forth in claim 11, wherein said ferromagnetic layer is made of one of a ferrite, iron (Fe), nickel (Ni), manganese (Mn) and chromium (Cr).

18. The Josephson junction as set forth in claim 11, wherein said substrate is made of one of magnesium oxide (MgO), sapphire ($Al_2O_3$), $LaAlO_3$, and $SrAlO_3$.

19. A Josephson device comprising said Josephson junction as set forth in claim 11.

* * * * *